(12) United States Patent
Goktepeli

(10) Patent No.: US 10,420,171 B2
(45) Date of Patent: Sep. 17, 2019

(54) SEMICONDUCTOR DEVICES ON TWO SIDES OF AN ISOLATION LAYER

(71) Applicant: QUALCOMM Incorporated, San Diego, CA (US)

(72) Inventor: Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 15/249,143

(22) Filed: Aug. 26, 2016

(65) Prior Publication Data

US 2018/0061766 A1 Mar. 1, 2018

(51) Int. Cl.

| | |
|---|---|
| *H01L 23/48* | (2006.01) |
| *H04W 88/02* | (2009.01) |
| *H01L 27/12* | (2006.01) |
| *H01L 23/66* | (2006.01) |
| *H01L 21/84* | (2006.01) |
| *H01L 21/762* | (2006.01) |
| *H01L 21/18* | (2006.01) |
| *H01L 21/768* | (2006.01) |
| *H01L 23/485* | (2006.01) |
| *H01L 27/092* | (2006.01) |
| *H01L 21/8238* | (2006.01) |
| *H01L 27/06* | (2006.01) |

(52) U.S. Cl.
CPC .......... *H04W 88/02* (2013.01); *H01L 21/187* (2013.01); *H01L 21/76256* (2013.01); *H01L 21/76897* (2013.01); *H01L 21/76898* (2013.01); *H01L 21/84* (2013.01); *H01L 23/481* (2013.01); *H01L 23/485* (2013.01); *H01L 23/66* (2013.01); *H01L 27/1203* (2013.01); *H01L 21/823871* (2013.01); *H01L 21/845* (2013.01); *H01L 27/0694* (2013.01); *H01L 27/092* (2013.01); *H01L 27/1211* (2013.01); *H01L 2223/6616* (2013.01); *H01L 2223/6677* (2013.01)

(58) Field of Classification Search
CPC ..... H01L 23/538; H01L 27/092; H01L 27/12; H01L 23/66; H01L 21/84; H01L 21/8238; H01L 21/762; H01L 29/78
See application file for complete search history.

(56) References Cited

U.S. PATENT DOCUMENTS

| | | | |
|---|---|---|---|
| 6,759,282 B2 | 7/2004 | Campbell et al. | |
| 7,202,140 B1 * | 4/2007 | Ang | H01L 21/76256 257/621 |
| 7,345,898 B2 | 3/2008 | Park et al. | |

(Continued)

*Primary Examiner* — Matthew C Landau
*Assistant Examiner* — Dmitriy Yemelyanov
(74) *Attorney, Agent, or Firm* — Qualcomm Incorporated/Seyfarth Shaw LLP

(57) ABSTRACT

An integrated circuit device includes only semiconductor devices with a same first polarity on one side of an insulator layer and only semiconductor devices with a different second polarity on an opposite side of the insulator layer to reduce size and complexity of the integrated circuit device as well as reducing the process steps associated with fabricating the integrated circuit device. Shared contacts between backside source/drain regions or spacers of the semiconductor devices with the first polarity and front-side source/drain regions or spacers of the semiconductor devices with the first polarity are used to connect the semiconductor devices on opposite sides of the insulator layer.

15 Claims, 34 Drawing Sheets

(56) References Cited

U.S. PATENT DOCUMENTS

| | | | |
|---|---|---|---|
| 8,669,135 B2 | 3/2014 | Kao et al. | |
| 9,165,829 B2 | 10/2015 | Lee | |
| 2008/0179678 A1* | 7/2008 | Dyer | H01L 21/84 |
| | | | 257/351 |
| 2009/0079000 A1* | 3/2009 | Yamazaki | H01L 23/433 |
| | | | 257/351 |
| 2011/0272762 A1* | 11/2011 | Booth, Jr. | H01L 21/84 |
| | | | 257/347 |
| 2015/0123202 A1 | 5/2015 | Lin et al. | |
| 2015/0348945 A1* | 12/2015 | Or-Bach | H01L 21/743 |
| | | | 257/384 |

* cited by examiner

SEMICONDUCTOR DEVICES ON TWO SIDES OF AN ISOLATION LAYER

TECHNICAL FIELD

The present disclosure generally relates to integrated circuits (ICs). More specifically, the present disclosure relates to semiconductor devices on two sides of an isolation layer.

BACKGROUND

Mobile radio frequency (RF) chip designs (e.g., mobile RF transceivers), including high performance diplexers have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

The design of these mobile RF transceivers may include the use of silicon on insulator (SOI) technology. SOI technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce the parasitic capacitance caused by the proximity of an active device on the silicon layer and a substrate supporting the BOX layer.

The active devices on the SOI layer may include complementary metal oxide semiconductor (CMOS) transistors. The process flow for semiconductor fabrication of CMOS transistors is generally performed during front-end-of-line (FEOL) processes. The front-end-of-line processes may include the set of process steps that form the active devices (e.g., transistors). The FEOL processes include ion implantation, anneals, oxidation, chemical vapor deposition (CVD) or atomic layer deposition (ALD), etching, chemical mechanical polishing (CMP), epitaxy. Unfortunately, these FEOL processes are generally limited to CMOS transistor formation on one side of a semiconductor wafer.

SUMMARY

An integrated circuit device may include a front-side transistor on a front-side surface of an isolation layer. The integrated circuit device may further include a backside transistor on a backside surface opposite the front-side surface of the isolation layer. Furthermore, the integrated circuit device includes a contact shared between the front-side transistor and the backside transistor.

A method of constructing an integrated circuit may include fabricating a front-side transistor on a front-side surface of an isolation layer. The method may further include bonding a handle substrate to a front-side dielectric layer on the front-side transistor. The method also includes fabricating a backside transistor on a backside surface of the isolation layer. Furthermore, the method includes fabricating a shared contact shared between the front-side transistor and the backside transistor.

An integrated circuit device may include a front-side transistor on a front-side surface of an isolation layer. The integrated circuit device may further include a backside transistor on a backside surface opposite the front-side surface of the isolation layer. Furthermore, the integrated circuit device includes means for electrically coupling the front-side transistor with the backside transistor.

A radio frequency (RF) front end module may include an integrated RF circuit device, comprising a front-side transistor on a front-side surface of an isolation layer, a backside transistor on a backside surface of the isolation layer, and a contact. The contact is shared between the front-side transistor and the backside transistor. The RF front end module may further include a switch transistor comprising the front-side transistor and the backside transistor. Furthermore, the RF front end module includes an antenna coupled to an output of the switch transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
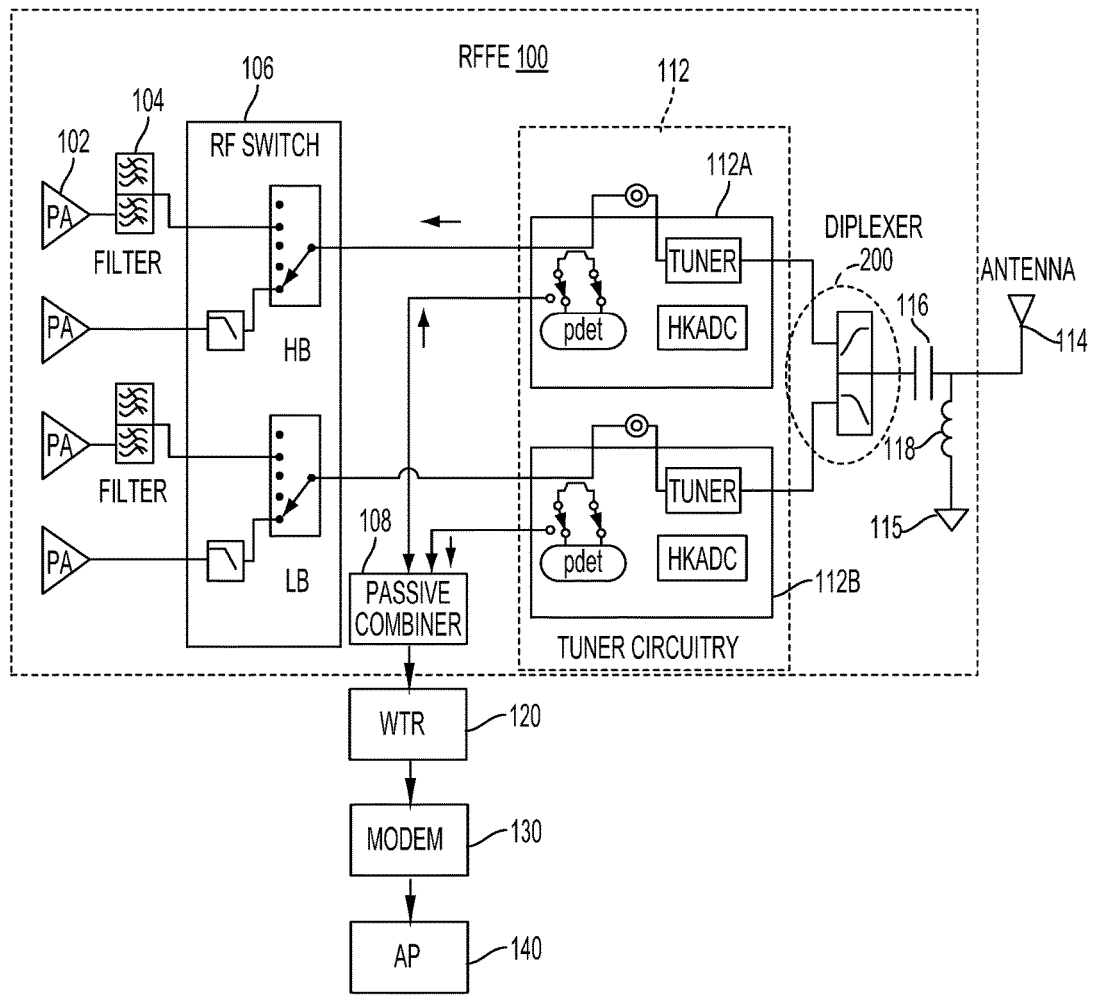
FIG. 1A is a schematic diagram of a radio frequency (RF) front end (RFFE) module employing a semiconductor device according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of passive devices, for example, to suppress resonance, and/or to perform filtering, bypassing and coupling.

Successful fabrication of modern semiconductor chip products involves interplay between the materials and the processes employed. The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes to form interconnects (e.g., M1, M2, M3, M4, etc.). The front-end-of-line processes may include the set of process steps that form the active devices, such as transistors, capacitors, diodes. The front-end-of-line processes include ion implantation, anneals, oxidation, chemical vapor deposition (CVD) or atomic layer deposition (ALD), etching, chemical mechanical polishing (CMP), epitaxy. The middle-of-line processes may include the set of process steps that enable connection of the transistors to BEOL interconnect. These steps include silicidation and contact formation as well as stress introduction. The back-end-of-line processes may include the set of process steps that form the interconnect that ties the independent transistors and form circuits. Currently, copper and aluminum provide the interconnects, but with further development of the technology other conductive material may be used.

In particular, the formation of conductive material plating for semiconductor fabrication in back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss to support mobile RF transceiver design.

The design of these mobile RF transceivers may include the use of silicon on insulator (SOI) technology. SOI technology replaces conventional silicon substrates with layered silicon-insulator-silicon substrates to reduce parasitic device capacitance and improve performance. SOI-based devices differ from conventional, silicon-built devices because the silicon junction is above an electrical isolator, typically a buried oxide (BOX) layer, in which a thickness of the BOX layer may be reduced. In addition, the active devices on an SOI layer may include complementary metal oxide semiconductor (CMOS) transistor. For example, complementary metal-oxide semiconductor (CMOS) processes may be used to form electronic devices, such as transistors, on a buried oxide (BOX) layer. However, some CMOS processes may enable formation of the devices on only one side of the buried metal oxide.

To reduce area occupied by devices, some CMOS processes may enable forming devices on both sides of the BOX layer. For example, after semiconductor devices are formed on one side of a BOX layer, hydrogen may be implanted from that side of the BOX layer, the BOX layer may be "flipped over," and a hydrogen layer (formed due to the hydrogen implantation) may be cleaved prior to formation of semiconductor devices on the other side of the BOX layer. However, hydrogen implantation may increase manufacturing complexity and/or cost.

Various aspects of the disclosure provide techniques for forming devices on multiple sides of a BOX layer without relying on hydrogen implantation. According to a first method, a first set of devices (e.g., semiconductor devices) may be formed on a first side of a BOX layer, where the BOX layer is positioned above an etch stop layer. In some implementations, the BOX layer may be a high K dielectric layer. A dielectric layer (e.g., insulator) may be deposited on and around the first set of devices, and a handle may be attached to the dielectric layer (e.g., the handle may be used to manipulate a die including the BOX layer during fabrication, such as to flip the die over). Next, an etching process may be performed to expose the etch stop layer, where the etching process is performed from a second side of the BOX layer that is opposite the first side. As used herein, an etching process may refer to a wet etching process or to a dry etching process. A planarization process (e.g., chemical mechanical planarization (CMP)) may be performed to remove the etch stop layer, after which a second set of devices may be formed on the second side of the BOX layer.

In some implementations, the BOX layer may be positioned above an etch enhancement layer instead of using an etch stop layer. The etch enhancement layer may be positioned above a substrate. After the die is flipped over, a planarization process (e.g., CMP) may be performed on the substrate to remove the substrate and to expose the etch enhancement layer. The etch enhancement layer may then be removed via etching, after which the second set of devices may be formed on a second side of the BOX layer opposite the first side.

Although aspects of the present disclosure are described with respect to silicon on insulator (SOI) technology, the aspects of the disclosure can also be implemented using other fabrication technologies for a planar transistor, a fin-type field effect transistor (FinFET), a nanotube, a bulk silicon alternative to the silicon-on-insulator technology, or other like semiconductor fabrication technology. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

In some aspects of the present disclosure, devices of a different type (e.g., different polarity) are placed on a same side of the BOX layer. For example, NMOS and PMOS devices are placed on a same side of the BOX layer. In addition, further combinations of devices include devices (NMOS and/or PMOS) with thin gate dielectrics and devices (NMOS and/or PMOS) with thick gate dielectrics may be placed on a same side of the BOX layer. Thin gate dielectrics may be used as a core or digital devices which are generally faster while thick gate devices may be used as input/output devices or analog devices which handle higher voltages.

In some aspects, the first set of devices may include NMOS devices and PMOS devices or devices with thin and thick gate dielectrics. Similarly, the second set of devices may include NMOS devices and PMOS devices or thin devices and thick devices. Other combination of mixed devices include devices with different purposes such as analog versus digital, devices with different technology node (e.g., 10 nm versus 28 nm), devices with different materials (e.g., silicon, silicon germanium (SiGe), gallium arsenide (GaAs), indium gallium arsenide (InGaAs), indium gallium phosphide (InGaP), gallium nitride (GaN), silicon carbide (SiC), etc.

Placement of NMOS devices and PMOS devices on the same side of the BOX layer increases the amount of processing steps associated with the placement of the different devices on the same side of the BOX layer. For example, placement of NMOS devices and PMOS devices on the same side of the BOX layer increases the number of masks for achieving the placement. Separate masks and processes are specified for each of the different devices. For example, separate masks and processes may be specified for the NMOS devices, the PMOS devices, the thick devices and the thin devices. The different devices have different specifications that are achieved with different masks or processes. For example, PMOS device performance is served by applying compressive strain to a channel, whereas NMOS devices benefit from tensile strain.

Because the materials and/or dopants for PMOS and NMOS are different, the PMOS and NMOS devices on the same side of the BOX layer are masked during application of the tensile and compressive stress. For example, when applying tensile stress to the NMOS device, a mask is used to remove the tensile etch stop layer. This implementation may be performed to accommodate the PMOS device on the same side of the BOX layer. Similarly, when applying compressive stress to the PMOS device, a mask is used to remove the compressive etch stop layer. This implementation is performed to accommodate the NMOS device on the same side of the BOX layer. Some of the additional device related masks and processes introduced when different devices (e.g., NMOS devices and PMOS devices) are placed on a same side of the BOX layer include multiple masks (e.g., two, one for n and one for p) for n/p channel doping, multiple masks (e.g., two, one for n and one for p) for n/p selective source drain (SD) epitaxial growth, multiple masks (e.g., two, one for n and one for p) for n/p high stress etch stop layers, multiple masks (e.g., two, one for n and one for p) for n/p-gate metal. Other masks including surface mount mask, lightly doped drain (LDD) and source drain (SD) implant masks.

In addition to masks, process steps are added as a result of the placement of the different devices on the same side of the BOX layer. For example, the additional process associated with the placement of the different devices (e.g., NMOS devices and PMOS devices) on the same side of the BOX layer include etches to remove, gate metal, etch stop layers, surface mount (SMT) film from unwanted locations. Other additional processes include selective epitaxial layer protection and etch. In some smaller technologies (e.g., 14 nm or smaller), some of the process steps specify hard masks, which further complicates the process. In addition, to accommodate these process steps, design rules are often relaxed.

To simplify the processing of semiconductor devices on dual sides (opposite sides) of a BOX layer, a first set of devices that are similar (e.g., same polarity) are placed on one side of the BOX layer, while a second set of devices that are different from the first set of devices are placed on a second side (e.g., opposite side) of the BOX layer. For example, only NMOS devices are placed on one side of the BOX layer and only PMOS devices are placed on an opposite side of the BOX layer. In some implementations, only thick devices are placed on one side of the BOX layer and only thin devices are placed on an opposite side of the BOX layer. Thus, after placing the NMOS devices on the same side of the BOX layer, no PMOS device related masks or processes have to be introduced to accommodate PMOS devices that are not on this side of the BOX layer. The resulting device (e.g., integrated circuit device) is then flipped and the PMOS devices are placed on the flipped side (which is opposite the side on which the NMOS devices are placed). In this case, after placing the PMOS devices on the flipped side of the BOX layer, no NMOS device related masks or processes have to be introduced to accommodate NMOS devices that are not on this side of the BOX layer.

Placement of only the devices of the same polarity, for example, on the same side of the BOX layer reduce the number of device related masks and processes associated with the placement while maintaining patterning masks. For example, patterning uses the process of photolithography and optical masks to print patterns that guide the deposition or removal of material from the wafer at specific steps in the device fabrication process. At each layer of the device, material is deposited or removed in those areas not covered by the mask and then a new mask is used for the next layer.

Device related masks steps or process steps including n-gate masks, p-gate masks, n-source drain mask, p-source drain masks, tensile etch stop layer step, compressive etch stop layer step and some surface mount process steps are avoided or eliminated when only the same devices are placed on the same side of the BOX layer. Other additional masks that may be subject to elimination when only the same devices are placed on the same side of the BOX layer include masks associated with an silicon germanium (SiGe) channel (or carbon doped silicon such as silicon carbide SiC), masks associated with a III-V channel, p well masks and n well masks. For example, a SiGe channel may be used for PMOS devices that are on a same side of the BOX layer. However, if the PMOS devices are on an opposite side of the channel, a carbon doped silicon may be used for the channel to apply stress.

The arrangement of the same or similar devices on the same side of the BOX layer and different devices on a different side of the BOX layer reduces a size (e.g., by 30%) of the die of the semiconductor devices (e.g., transistors) and consequently the size of the resulting device (e.g., having only semiconductor devices of a first polarity on one side of the BOX layer and having only semiconductor devices of a different polarity on an opposite side of the BOX layer). The number of masks also heavily impacts a unit price of the resulting device. Thus, the reduction in the number of masks causes a reduction in the price of the resulting device. Further, eliminating some of the device related masks and process steps reduces processing time (e.g., by up to seven days). Aspects of the present disclosure eliminate multiple process steps and their corresponding etch/deposition/anneal that reduces processing time (e.g., by up to thirteen days). Layer transfer steps are also reduced, which causes a corresponding reduction in processing time (e.g., 4-5 days).

Connecting the first set of devices (e.g., transistors) on one side of the BOX layer to the second set of devices on an opposite side of the BOX layer is subject to challenges. Some of the challenges are directed to extra space occupied by one or more contacts (e.g., a front-to-backside contact) connecting the first set of devices (e.g., transistors) on one side of the BOX layer to the second set of devices on an opposite side of the BOX layer. For example, the front-to-backside contacts can take too much space and negate the space savings achieved by the concepts of the present disclosure. Aspects of the present disclosure are directed to mitigating the challenges associated with the extra space occupied by the front-to-backside contacts.

One aspect of the present disclosure uses shared contacts between the backside source/drain contacts and the front-side source/drain regions of the resulting device (e.g., having only semiconductor devices (e.g., transistors) of a first polarity on one side of the BOX layer and having only semiconductor devices of a different polarity on an opposite side of the BOX layer). In addition, contacts may be shared between the backside gates and the front-side gates of the resulting device.

FIG. 1A is a schematic diagram of a radio frequency (RF) front end (RFFE) module 100 employing a semiconductor device (e.g., a diplexer 200) according to an aspect of the present disclosure. Although a diplexer is described here, other semiconductor devices may be applicable. For example, the semiconductor devices may be based on the dual-sided device described in accordance with aspects of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
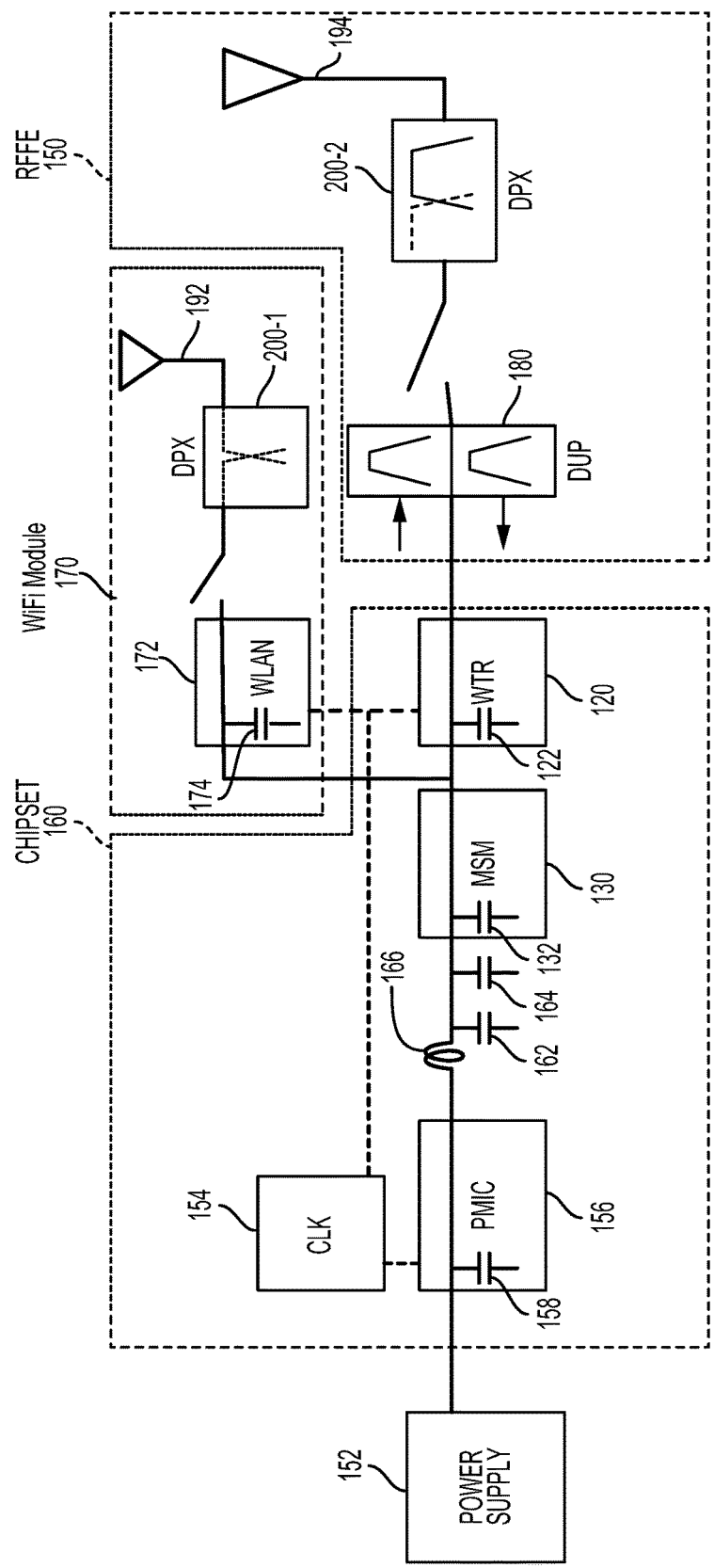
FIG. 1B is a schematic diagram of a radio frequency (RF) front end (RFFE) module employing semiconductor devices for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2:
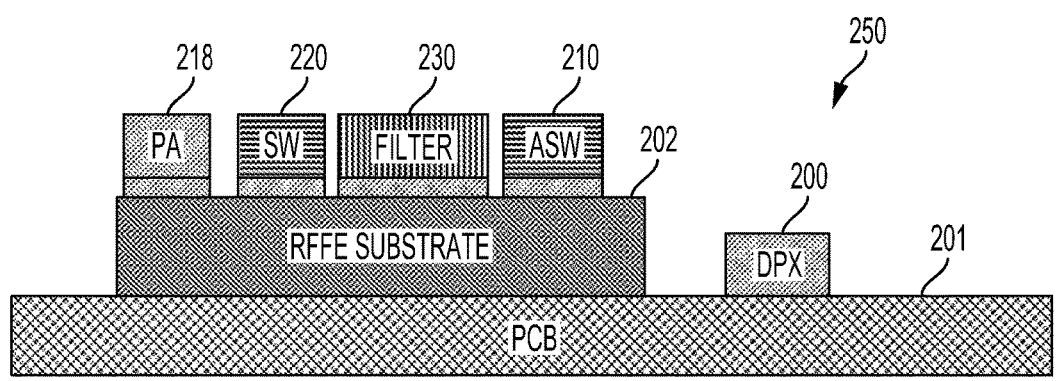
FIG. 2 is a diagram of a radio frequency (RF) front end module according to an aspect of the present disclosure.

FIG. 2 is a diagram of an RF front end module 250 according to an aspect of the present disclosure. The RF front end module 250 includes the antenna switch (ASW) 210 (e.g., a switch transistor) and diplexer 200 (or triplexer) to enable the wide range band. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250. The diplexer 200 may be implemented as a surface mount device (SMD) on a system board 201 (e.g., printed circuit board (PCB) or package substrate). Alternatively, the diplexer 200 may be implemented on the substrate 202.

In this configuration, the RF front end module 250 is implemented using silicon on insulator (SOI) technology, which helps reduce high order harmonics in the RF front end module 250. SOI technology replaces conventional silicon substrates with a layered silicon-insulator-silicon substrate to reduce parasitic device capacitance and improve performance. SOI-based devices differ from conventional silicon-built devices because the silicon junction is above an electrical insulator, typically a buried oxide (BOX) layer. Aspects of the present disclosure include a layer transfer process to form a dual-sided device having semiconductor devices on two sides of the BOX layer, as shown in FIGS. 3, 4A-4G, and 5A-5G.

Figure 3:
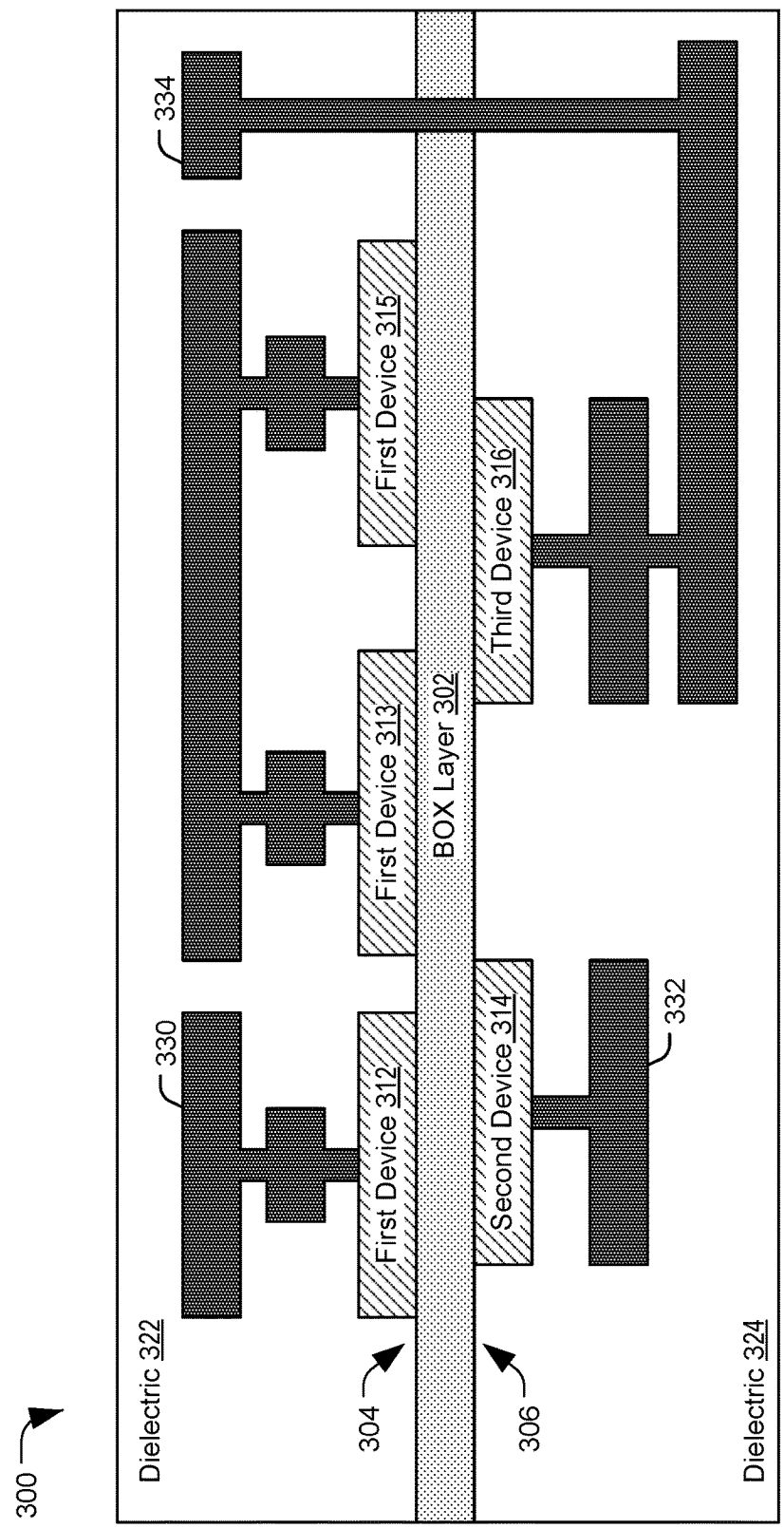
FIG. 3 is a diagram of a device having semiconductor devices on two sides of a buried oxide (BOX) layer according to an aspect of the present disclosure.

FIG. 3 is a diagram of a dual-sided active device 300 having semiconductor devices on two sides of a BOX layer, according to aspects of the present disclosure. The dual-sided device may be integrated into a radio frequency (RF) circuit structure. The dual-sided device may be fabricated using a layer transfer process according to aspects of the present disclosure.

The dual-sided active device 300 includes a BOX layer 302, and the BOX layer 302 includes a first side 304 and a second side 306. Devices having semiconductor devices on two sides of a BOX layer may further include one or more dielectric layers. For example, the dual-sided active device 300 includes a first dielectric layer 322 and a second dielectric layer 324.

The dual-sided active device 300 includes a first set of semiconductor devices 312 (e.g., first semiconductor device 312), 313, and 315 located on the first side 304 of the BOX layer 302. The first set of semiconductor devices 312, 313, and 315 are all NMOS devices. The dual-sided active device 300 further includes a second set of semiconductor devices including a second semiconductor device 314 and a third semiconductor device 316 located on the second side 306 of the BOX layer 302. The second set of semiconductor devices including a second semiconductor device 314 and a third semiconductor device 316 are all PMOS devices. The first set of semiconductor devices 312, 313 and 315, the second semiconductor device 314, and the third semiconductor device 316 may be transistors. Semiconductor devices formed on the second side 306 of the BOX layer 302 may be formed after removal of an etch stop layer or an etch enhancement layer without performing hydrogen implantation, as described further with reference to FIGS. 4A-4G and 5A-5G. Alternatively, semiconductor devices on the first side 304 of the BOX layer 302 may be formed after removal of an etch stop layer or an etch enhancement layer without performing hydrogen implantation, as described further with reference to FIGS. 4A-4G and 5A-5G.

Semiconductor devices of the dual-sided active device 300 may be coupled to conductive structures (e.g., contacts, pads, vias, interconnects, etc.) that may enable other devices to be coupled to the semiconductor devices. For example, the first semiconductor device 312 is coupled to a first metal structure 330 and the second semiconductor device 314 is coupled to a second metal structure 332. In particular examples, a metal structure may traverse the BOX layer 302 of the dual-sided active device 300, enabling electrical connections to a semiconductor device from either side of the BOX layer 302. For example, the third semiconductor device 316 is coupled to a third metal structure 334. The third metal structure 334 traverses the BOX layer 302. Thus, the third metal structure 334 may enable electrical connections to the third semiconductor device 316 from either the first side 304 or the second side 306 of the BOX layer 302.

Having devices on both sides (304, 306) of the BOX layer 302 may enhance performance of the dual-sided active device 300 (e.g., by reducing lengths of signaling paths between the devices). Further, the dual-sided active device 300 may have a reduced die area (e.g., because more devices may fit on two sides of a wafer than on one side of the wafer). Thus, in some examples, the dual-sided active device 300 may be suitable for use in electronic devices having small form factors (e.g., embedded devices, mobile communication devices, wearable devices, etc.)

FIGS. 4A-4G are diagrams illustrating stages of a first method of fabricating (e.g., first fabrication process) a dual-sided device (e.g., the dual-sided active device 300) having semiconductor devices on two sides of a BOX layer according to aspects of the present disclosure. The stages of the first fabrication method are shown as cross-sectional views of formation of the dual-sided active device 300.

Figure 4A:
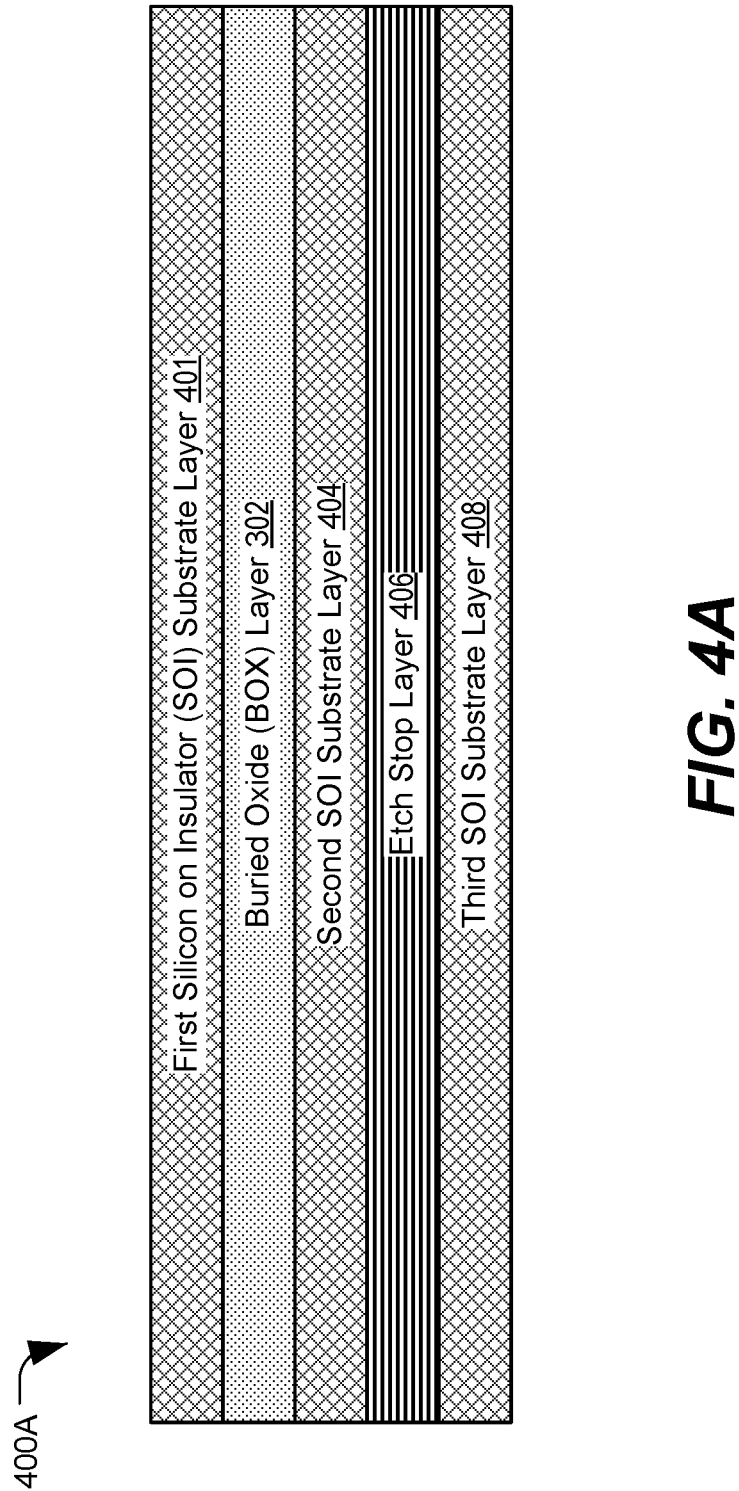
FIGS. 4A, 4B, 4C, 4D, 4E, 4F, and 4G are exemplary diagrams illustrating stages of a first method of fabricating a dual-sided device having semiconductor devices on two sides of a buried oxide (BOX) layer according to an aspect of the present disclosure.

Referring to FIG. 4A, a first stage of the first fabrication process is depicted and generally designated 400A. FIG. 4A illustrates a first silicon on insulator (SOI) substrate layer 401, the BOX layer 302 of FIG. 3, a second SOI substrate layer 404 (e.g., a backside semiconductor layer), an etch stop layer 406, and a third SOI substrate layer 408. The etch stop layer 406 is positioned between the second SOI substrate layer 404 and the third SOI substrate layer 408, and the BOX layer 302 is positioned between the second SOI substrate layer 404 and the first SOI substrate layer 401. The first SOI substrate layer 401, the BOX layer 302 of FIG. 3, the second SOI substrate layer 404, the etch stop layer 406, and the third SOI substrate layer 408 may be included in a wafer, a die, or another chip or device upon which semiconductor fabrication may be performed. In particular implementations, the etch stop layer 406 may be formed in the wafer via an ion implantation process, an epitaxial growth process, or a porous silicon formation process.

Figure 4B:
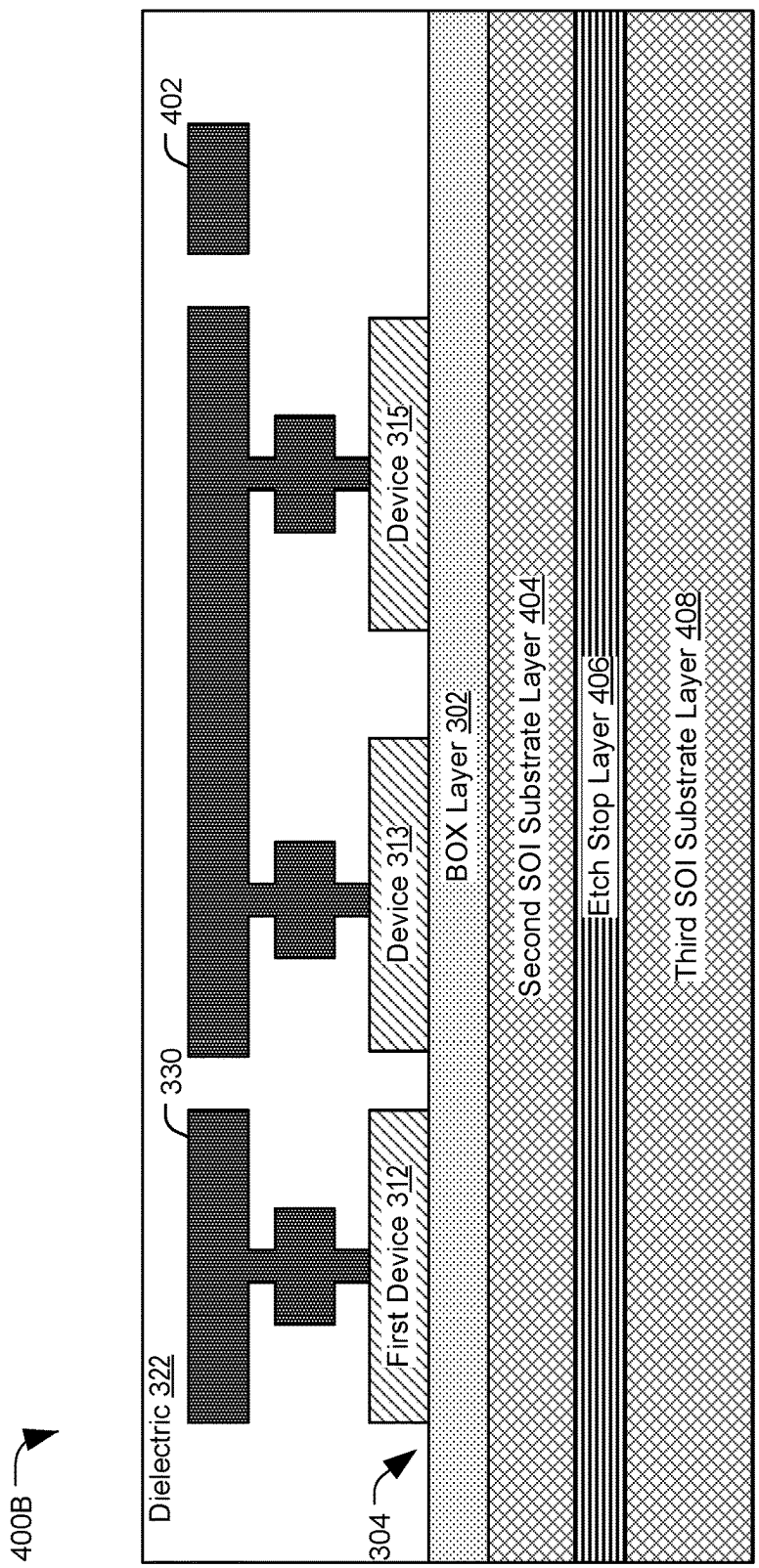

Referring to FIG. 4B, a second stage of the first fabrication process is depicted and generally designated 400B. The second stage 400B may follow the first stage 400A. A front-side device layer is formed during the second stage where only devices of a same type (e.g., same polarity or same size) are formed on this side of the BOX layer. For example, only NMOS devices (e.g., with NMOS gate metal) are placed on this side of the BOX layer 302. Thus, after placing the NMOS devices on the same side of the BOX layer 302, no PMOS device related masks or processes are introduced to accommodate PMOS devices that are not on this side of the BOX layer 302.

FIG. 4B illustrates a first set of semiconductor devices 312 (e.g., first semiconductor device 312), 313, and 315 on the first side 304 of the BOX layer 302. The first set of semiconductor devices 312, 313, and 315 are all NMOS devices. The first set of semiconductor devices 312, 313, and 315 may be formed, for example, by one or more semiconductor manufacturing processes. For example, one or more etching processes, doping processes, planarization processes, deposition processes, epitaxial growth processes, etc. may be applied to the first SOI substrate layer 401 (and any additional layers formed on the first SOI substrate layer 401) to form the first semiconductor device 312 and to remove the first SOI substrate layer 401. The processes may also include active device definition, channel implants, dummy gate formation, source-drain formation and n-gate formation (if gate, last, is used to form the dummy gate). The n-gate may be formed using a high-K dielectric and n-gate metal.

In some implementations, when channel doping is specified for the front-side device layer, only p-channel is used. Further, the source-drain epitaxial growth for the formation of the NMOS devices may be based on n-type (n+) doping and tensile film (Si(x)C(1−x) implementation (carbon doped silicon). When III-V materials are specified for the formation of the NMOS devices, only NMOS specific material such as InGaAs, InP, or other NMOS are used. The strain applicable when only NMOS devices are formed on this side of the BOX layer is tensile with etch stop layer and surface mount process. The strain applicable when only PMOS devices are formed on this side of the BOX layer is compressive only with etch stop layer.

FIG. 4B further illustrates the first dielectric layer 322, the first metal structure 330, and a first portion 402 of the third metal structure 334 (not shown). For example, the first dielectric layer 322 may be formed via a physical vapor deposition process. In an illustrative example, one or more cavities may be formed in the first dielectric layer 322 (e.g., via an etching process) and the first metal structure 330 and the first portion 402 of the third metal structure 334 may be formed in the one or more cavities (e.g., via one or more physical vapor deposition processes).

Figure 4C:
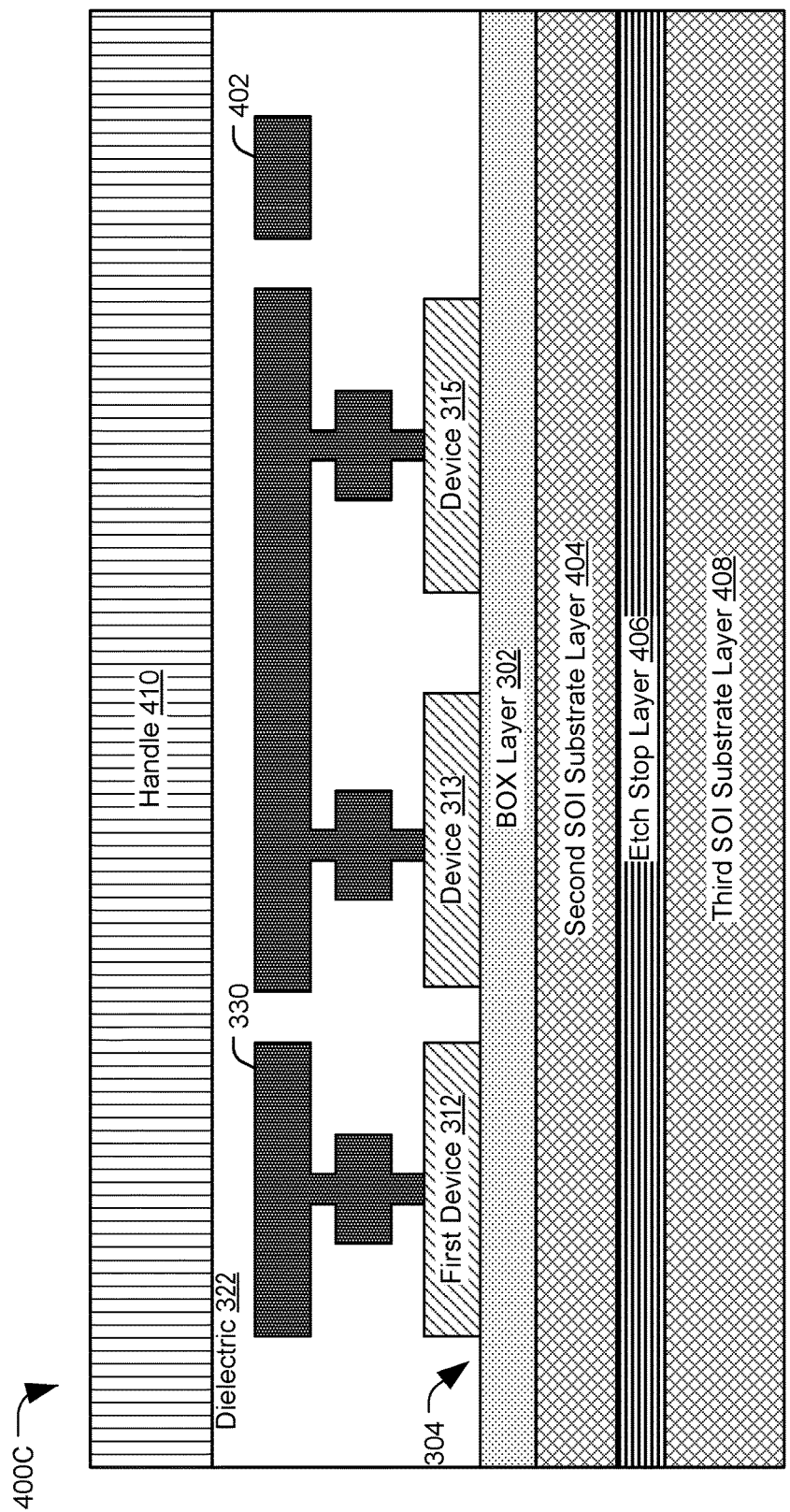

Referring to FIG. 4C, a third stage of the first fabrication process is depicted and generally designated 400C. The third stage 400C may follow the second stage 400B. FIG. 4C illustrates a handle 410 bonded (e.g., physically and/or chemically) to the first dielectric layer 322. The handle 410 may be bonded to the first dielectric layer 322 via a transfer process, in an illustrative example.

Figure 4D:
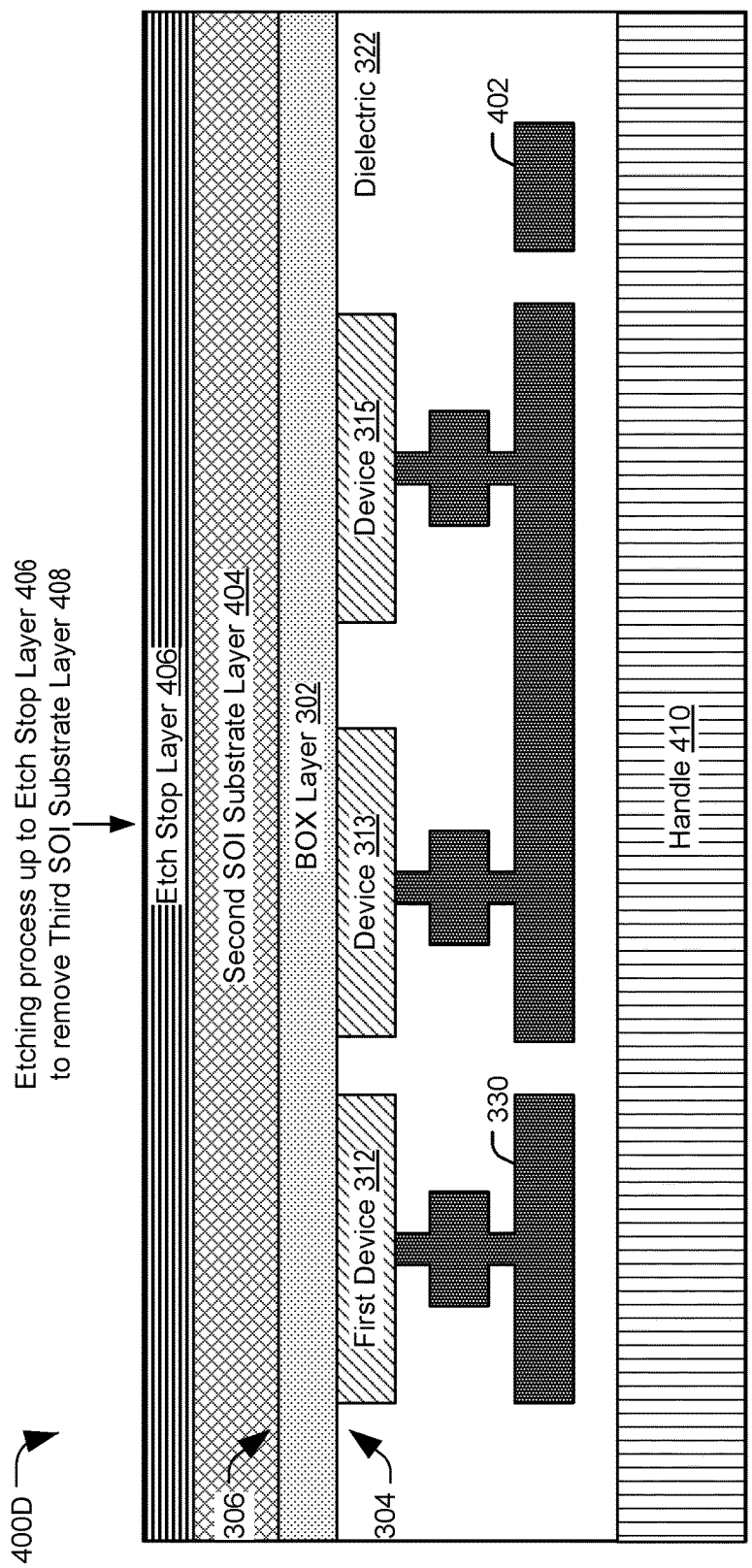

Referring to FIG. 4D, a fourth stage of the first fabrication process is depicted and generally designated 400D. The fourth stage 400D may follow the third stage 400C. In between the fourth stage 400D and the third stage 400C, the device (including the layers 408, 406, 404, 302, 322) may be flipped over, and the third SOI substrate layer 408 may be removed. For example, an automated arm may grip the handle 410 and rotate the device. In some examples, the device may not be flipped. In particular examples, the device may be flipped without using the handle 410. Thus, in alternate examples, the device may not include a handle. The third SOI substrate layer 408 may be removed via an etch process performed to expose the etch stop layer 406.

Figure 4E:
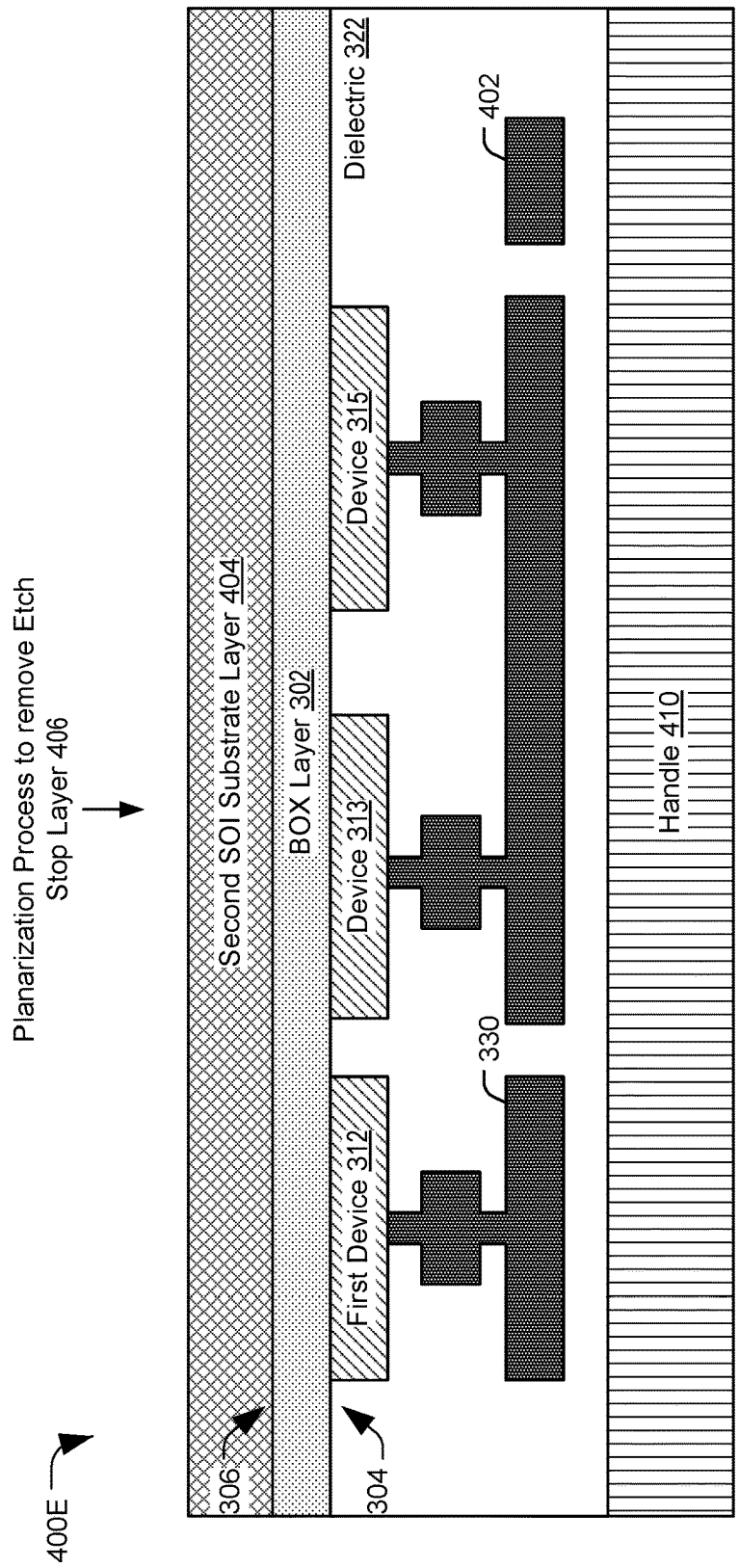

Referring to FIG. 4E, a fifth stage of the first fabrication process is depicted and generally designated 400E. The fifth stage 400E may follow the fourth stage 400D. In between the fifth stage 400E and the fourth stage 400D, the etch stop layer 406 may be removed. For example, the etch stop layer 406 may be removed using a planarization process (e.g., a chemical mechanical planarization (CMP) process or another polishing process).

Figure 4F:
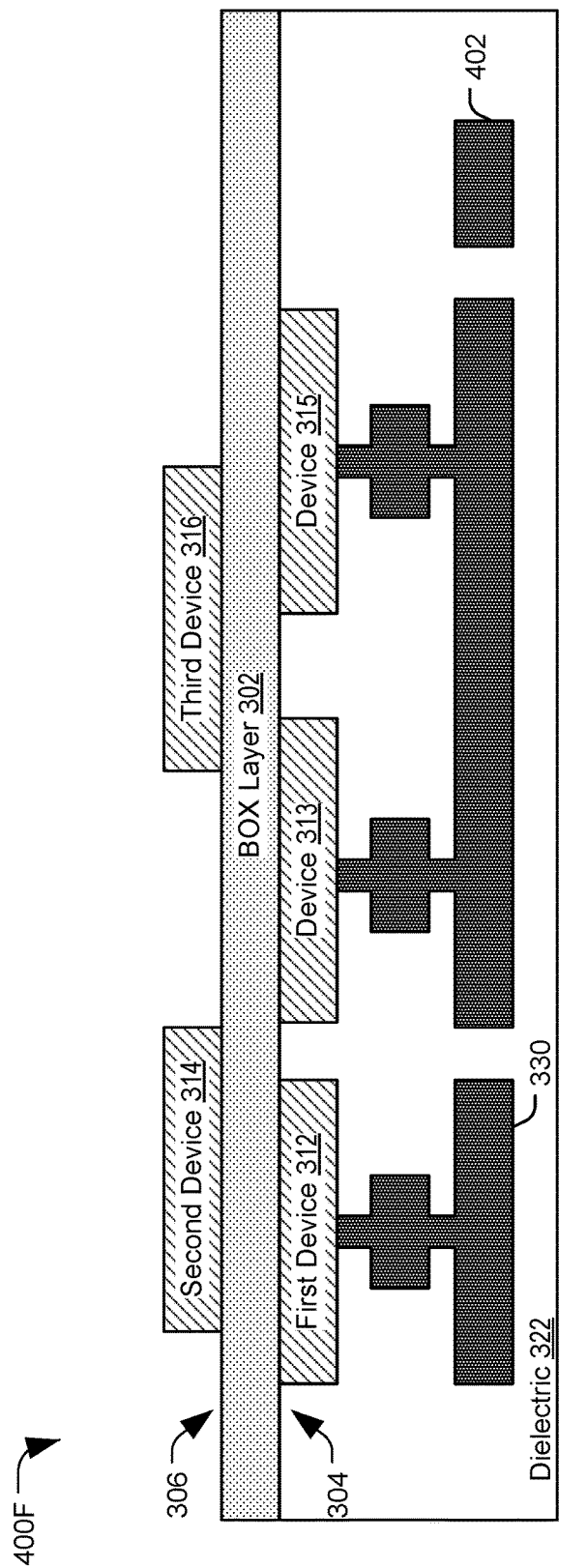

Referring to FIG. 4F, a sixth stage of the first fabrication process is depicted and generally designated 400F. The sixth stage 400F may follow the fifth stage 400E. In between the sixth stage 400F and the fifth stage 400E, additional devices, such as a second set of semiconductor devices including the second semiconductor device 314 and the third semiconductor device 316, may be formed on the second side 306 of the BOX layer 302. The second set of semiconductor devices 314 and 316 are all PMOS devices.

The second semiconductor device 314 and the third semiconductor device 316 may be formed, in some examples, by one or more semiconductor manufacturing processes. For example, one or more etching processes, doping processes, planarization processes, deposition processes (e.g., physical vapor deposition, chemical vapor deposition, atomic layer deposition, etc.), epitaxial growth processes, annealing processes, silicidation processes, stress introduction processes, etc. may be applied to the second SOI substrate layer 404 (and any additional layers formed on the second SOI substrate layer 404) to form the second semiconductor device 314 and the third semiconductor device 316 and to remove the second SOI substrate layer 404. The processes may also include active device definition, channel implants, dummy gate formation, source-drain formation and p-gate formation. The p-gate may be formed using a high-K dielectric and p-gate metal.

In some implementations, when channel doping is specified for the backside device layer, only n-channel is used (e.g., SiGe channel epitaxial growth). Further, the source-drain epitaxial growth for the formation of the PMOS devices may be based on n-type (n+) doping and tensile film (Si(x)Ge(1−x) tensile implementation.) The strain applicable when only PMOS devices are formed on this side of the BOX layer is compressive only with etch stop layer. The strain applicable when only NMOS devices are formed on this side of the BOX layer is tensile only with etch stop layer.

In alternate embodiments, at least a portion of the second SOI substrate layer 404 may be removed prior to formation of the second semiconductor device 314 and the third semiconductor device 316.

Figure 4G:
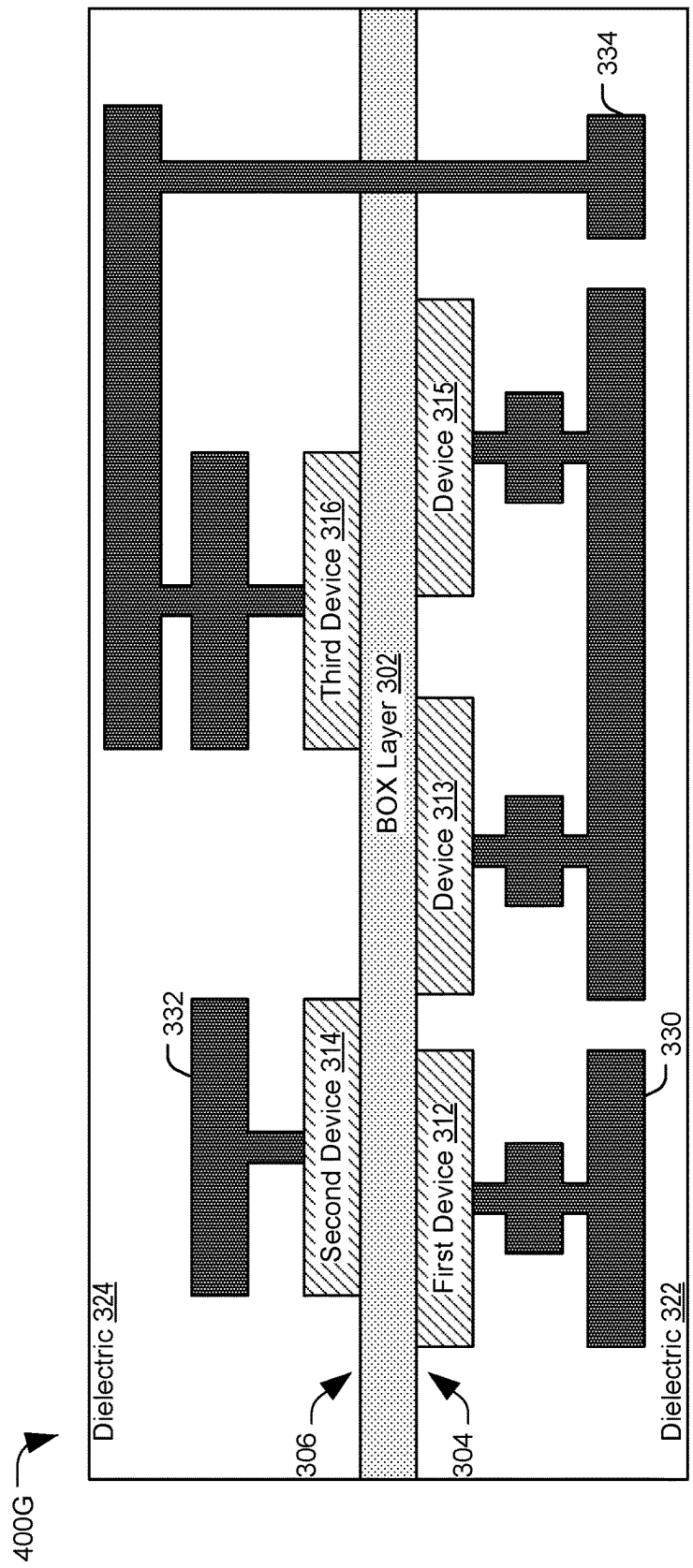

Referring to FIG. 4G a seventh stage of the first fabrication process is depicted and generally designated 400G. The seventh stage 400G may follow the sixth stage 400F. In between the seventh stage 400G and the sixth stage 400F, the second metal structure 332 and the second dielectric layer 324 may be formed and the third metal structure 334 may be completed. The second dielectric layer 324 may be formed via a physical vapor deposition process. In an illustrative example, one or more cavities may be formed in the second dielectric layer 324 (e.g., via an etching process) and the second metal structure 332 and remainder of the third metal structure 334 may be formed in the one or more cavities (e.g., via one or more physical vapor deposition processes). In a particular example, completing the third metal structure 334 includes etching through the BOX layer 302 and the first dielectric layer 322 to the first portion 402 of the third metal structure 334.

FIG. 4G may illustrate the dual-sided active device 300 of FIG. 3 in a flipped orientation. Thus, the first process illustrated in FIGS. 4A-4G may be used to fabricate a device having semiconductor devices on two sides of a BOX layer, such as the dual-sided active device 300 of FIG. 3. It is noted that the first process may not include a hydrogen implantation process, and may be less expensive than processes of fabrication a device that include the hydrogen implantation process. The first process may involve a decreased number of masks as compared to other processes of fabricating devices.

FIGS. 5A-5G are diagrams illustrating stages of a second method or process of fabricating a device having semiconductor devices on two sides of a BOX layer. The stages of the second fabrication process are shown as cross-sectional views of formation of the device.

Figure 5A:
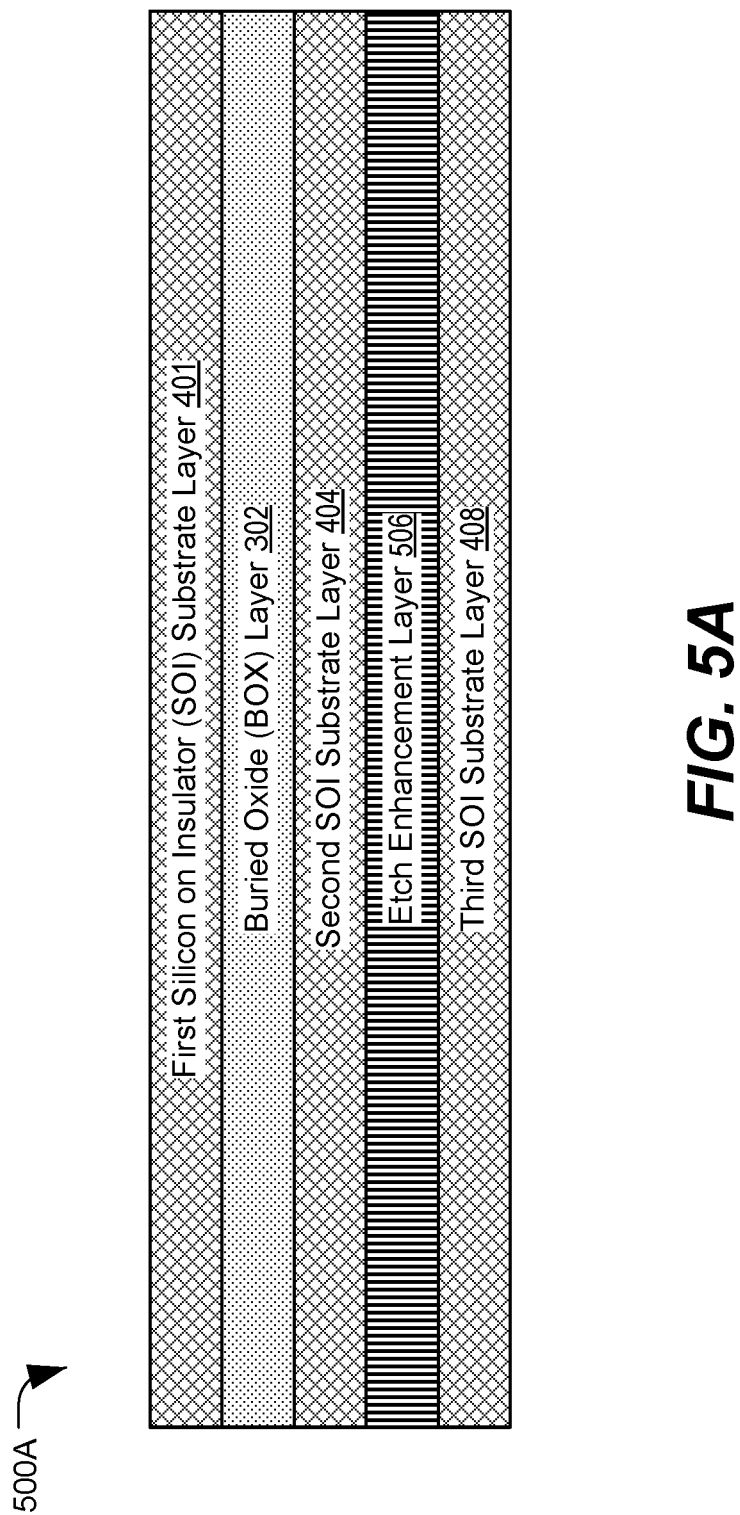
FIGS. 5A, 5B, 5C, 5D, 5E, 5F, and 5G are exemplary diagrams illustrating stages of a second method of fabricating a dual-sided device having semiconductor devices on two sides of a buried oxide (BOX) layer according to an aspect of the present disclosure.

Referring to FIG. 5A, a first stage of the second fabrication process is depicted and generally designated 500A. The first stage 500A may correspond to the first stage 400A, illustrated and described with reference to FIG. 4A, except that FIG. 5A depicts an etch enhancement layer 506 in place of the etch stop layer 406 of FIG. 4A. The etch enhancement layer 506 may be made of a material that may be removed relatively quickly by an etching process as compared to other materials.

Figure 5B:
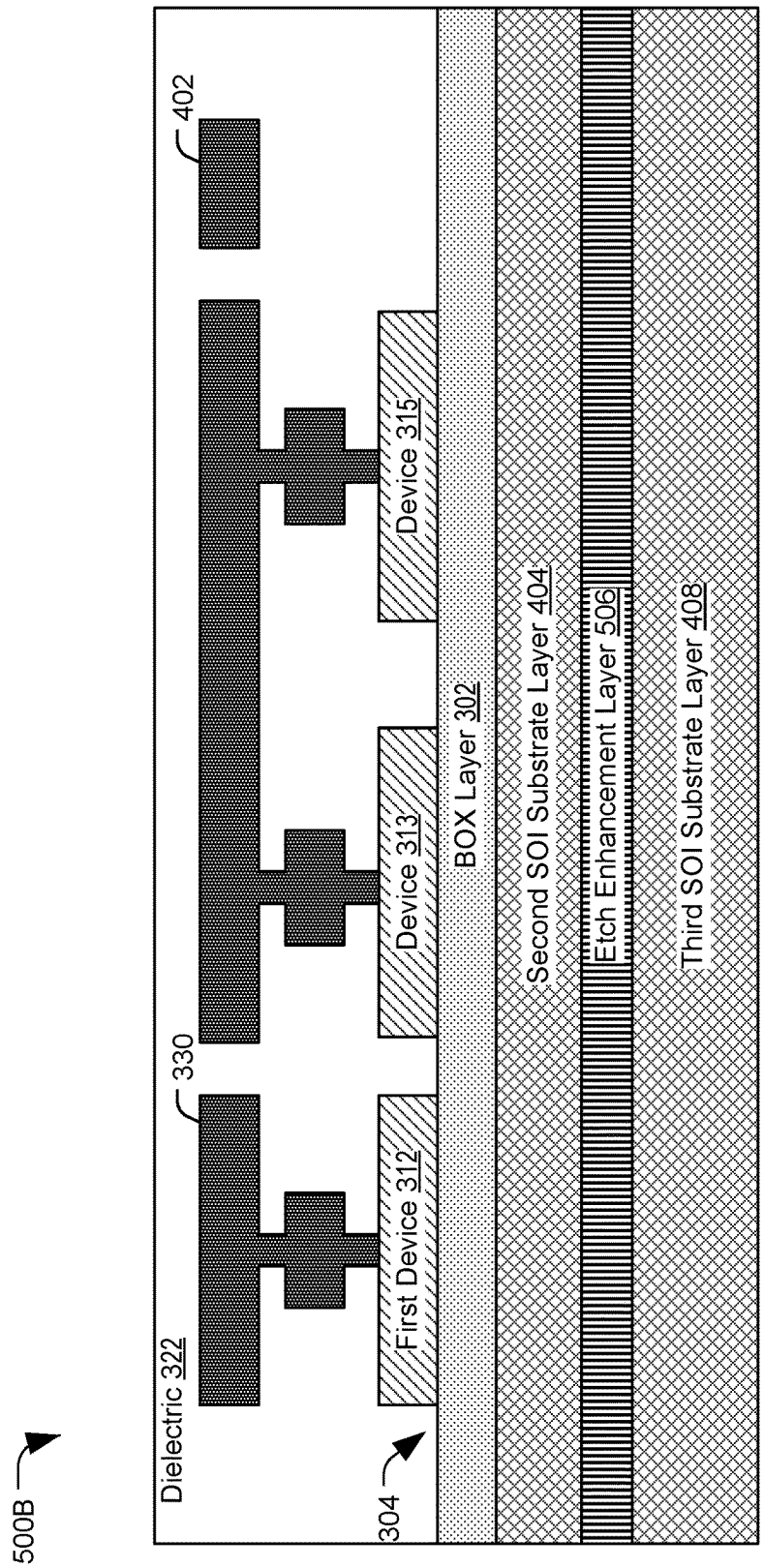

Referring to FIG. 5B, a second stage of the second fabrication process is depicted and generally designated 500B. The second stage 500B may follow the first stage 500A. The second stage 500B may correspond to the second stage 400B, illustrated and described with reference to FIG. 4B, except that FIG. 5B depicts the etch enhancement layer 506 in place of the etch stop layer 406 of FIG. 4B.

Figure 5C:
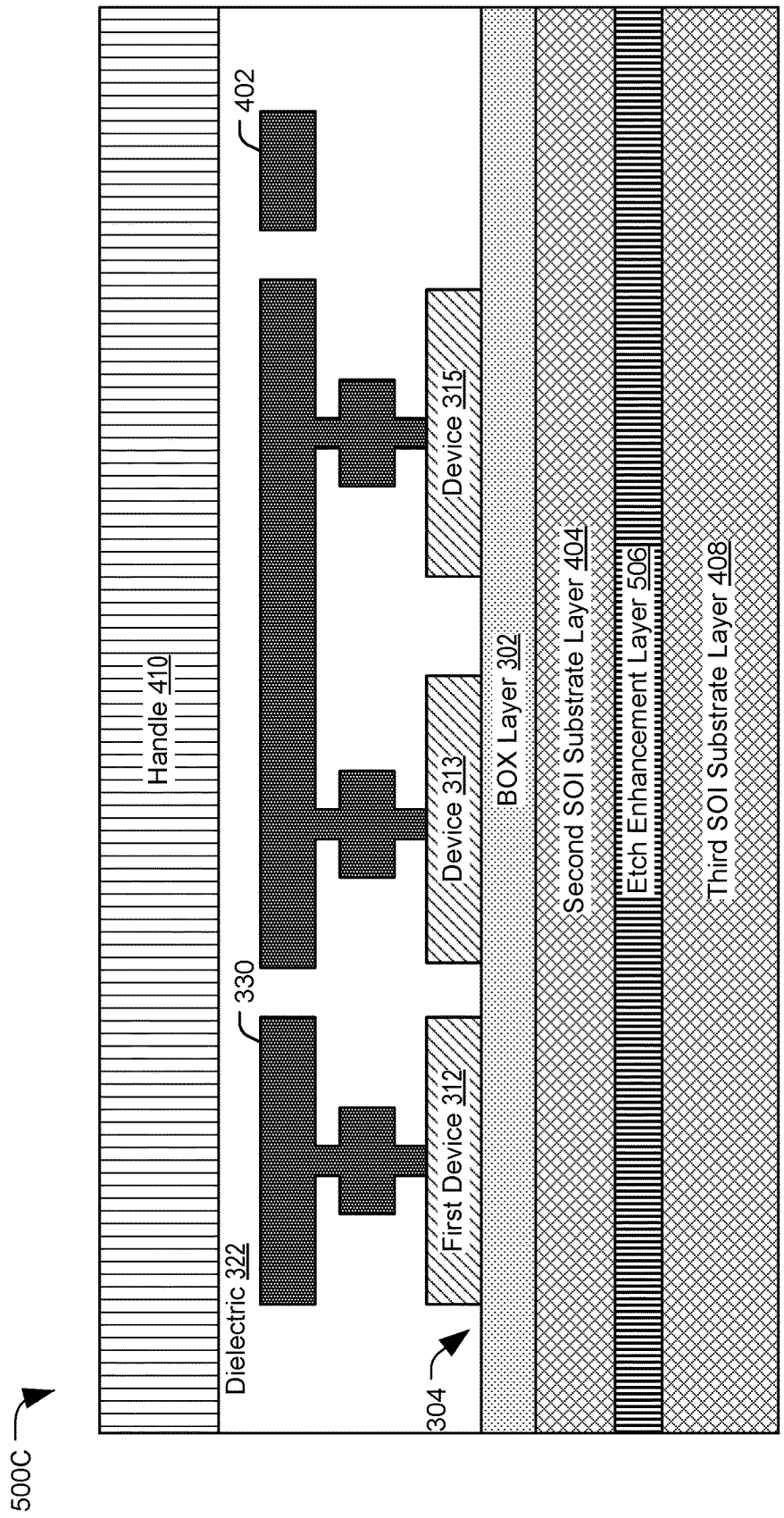

Referring to FIG. 5C, a third stage of the second fabrication process is depicted and generally designated 500C. The third stage 500C may follow the second stage 500B. The third stage 500C may correspond to the third stage 400C, illustrated and described with reference to FIG. 4C, except that FIG. 5C depicts the etch enhancement layer 506 in place of the etch stop layer 406 of FIG. 4C.

Figure 5D:
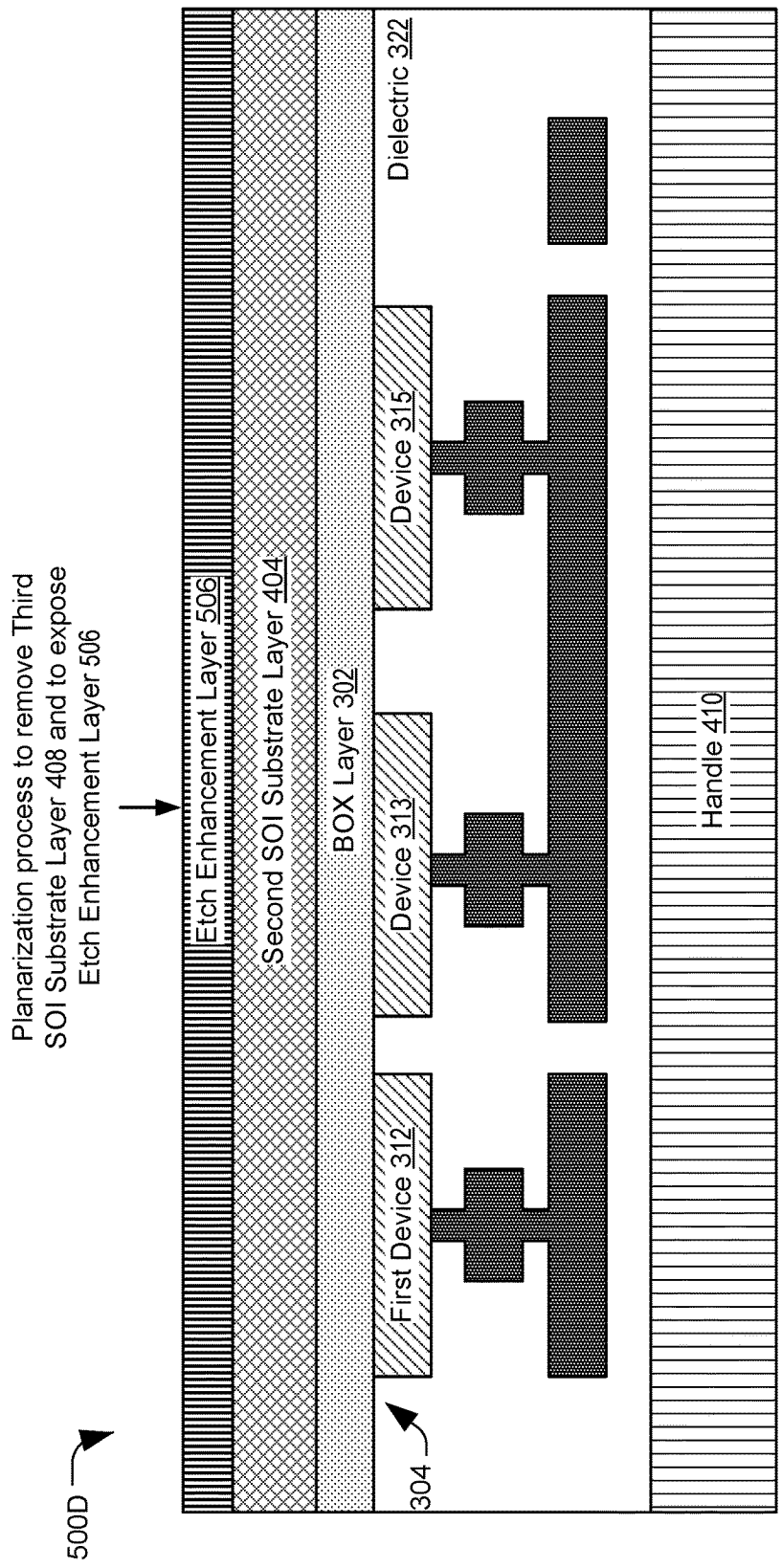

Referring to FIG. 5D, a fourth stage of the second fabrication process is depicted and generally designated 500D. The fourth stage 500D may follow the third stage 500C. In between the fourth stage 500D and the third stage 500C, the device (including the layers 408, 506, 404, 302, 322) may be flipped over, and the third SOI substrate layer 408 may be removed. For example, an automated arm may grip the handle 410 and rotate the device. In some examples, the device may not be flipped. In particular examples, the device may be flipped without using the handle 410. Thus, in alternate examples, the device may not include a handle. The third SOI substrate layer 408 may be removed via a planarization process (e.g., a CMP process or another type of polishing process) performed to expose the etch enhancement layer 506.

Figure 5E:
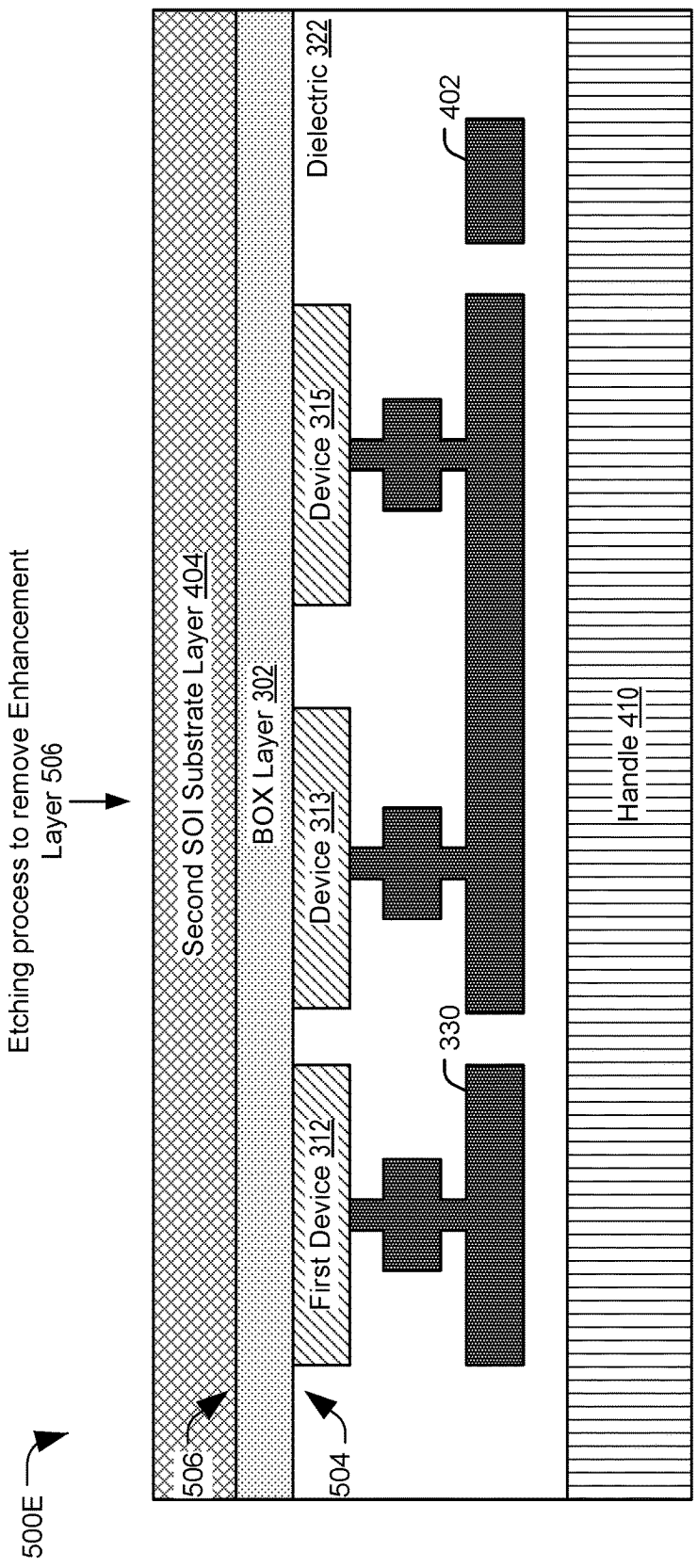

Referring to FIG. 5E, a fifth stage of the second fabrication process is depicted and generally designated 500E. The fifth stage 500E may follow the fourth stage 500D. In between the fifth stage 500E and the fourth stage 500D, the etch enhancement layer 506 may be removed. For example, the etch enhancement layer 506 may be removed using an etching process.

Figure 5F:
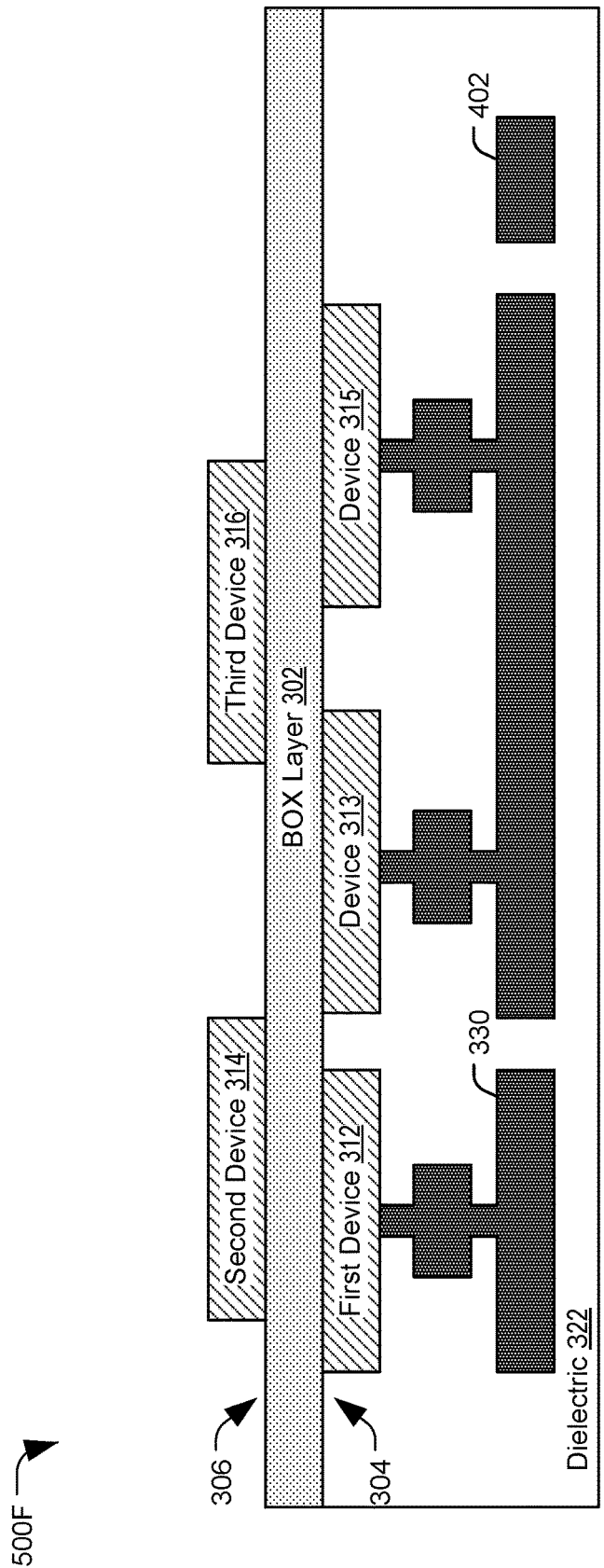

Referring to FIG. 5F, a sixth stage of the second fabrication process is depicted and generally designated 500F. The sixth stage 500F may follow the fifth stage 500E. The sixth stage 500F may correspond to the sixth stage 400F, illustrated and described with reference to FIG. 4F.

Figure 5G:
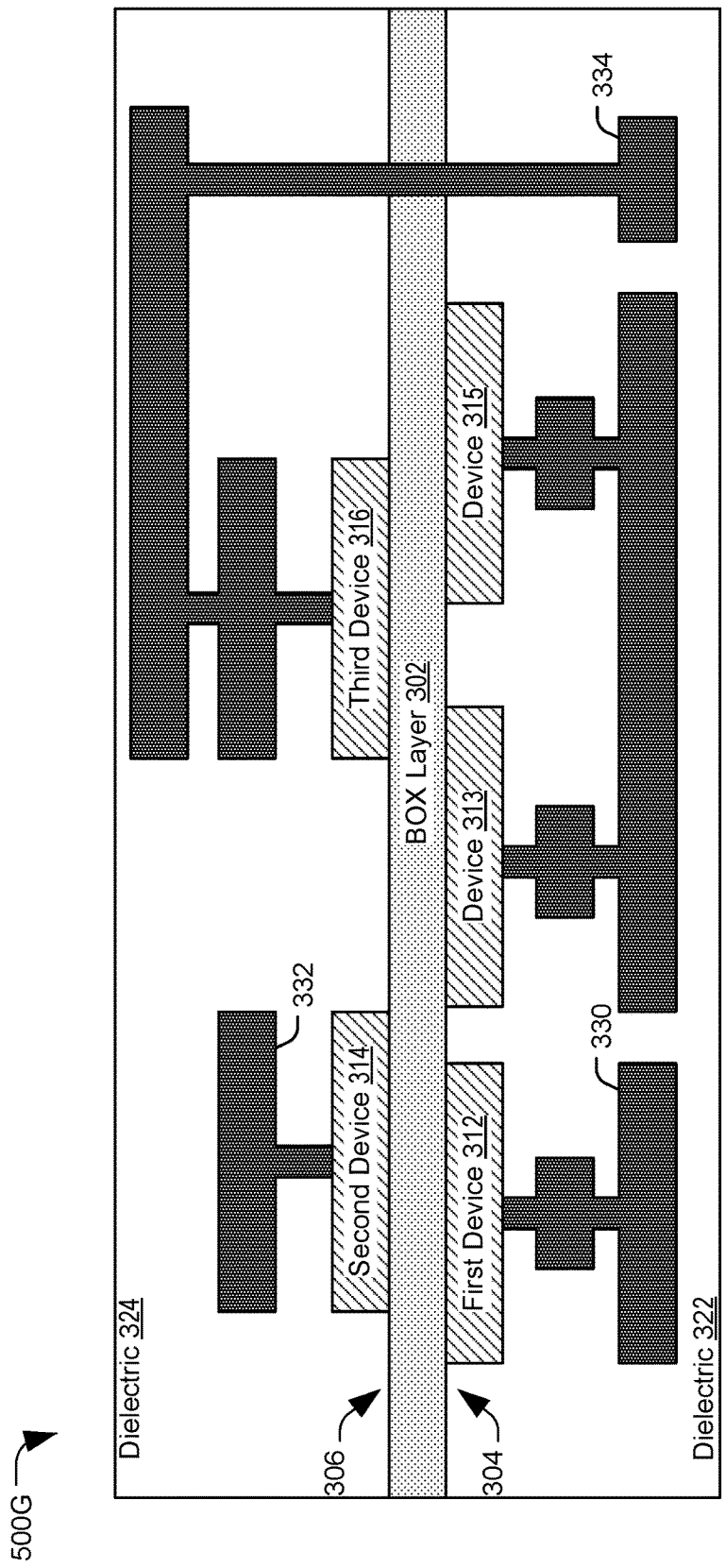

Referring to FIG. 5G, a seventh stage of the second fabrication process is depicted and generally designated 500G. The seventh stage 500G may follow the sixth stage 500F. The seventh stage 500G may correspond to the seventh stage 400G, illustrated and described with reference to FIG. 4G.

Thus, the second process illustrated in FIGS. 5A-5G may be used to fabricate a device having semiconductor devices on two sides of a BOX layer, such as the dual-sided active device 300 of FIG. 3. It is noted that the second process may not include a hydrogen implantation process, and may be less expensive than processes of fabrication a device that include the hydrogen implantation process. Further, the second process may utilize fewer masks as compared to other device fabrication processes. As illustrated and described with reference to FIGS. 4D and 4E, the first process may include an etching process followed by a planarization process. The second process may include a planarization process followed by an etching process, as illustrated and described with reference to FIGS. 5D and 5E.

Access to active devices, formed during a front-end-of-line (FEOL) process, is conventionally provided during middle-end-of-line (MEOL) processing that provides contacts between the gates and source/drain regions of the active devices and back-end-of-line (BEOL) interconnect layers (e.g., M1, M2, etc.). In the dual-sided device, however, connecting the first set of devices (e.g., active devices) on one side of the buried oxide (BOX) layer to the second set of devices on the opposite side of the BOX layer is subject to challenges. For example, one or more contacts (e.g., front-to-backside contacts) connecting the first set of devices on one side of the BOX layer to the second set of devices on an opposite side of the BOX layer take up too much space and negate the space savings achieved by the aspects of the present disclosure.

Figure 6:
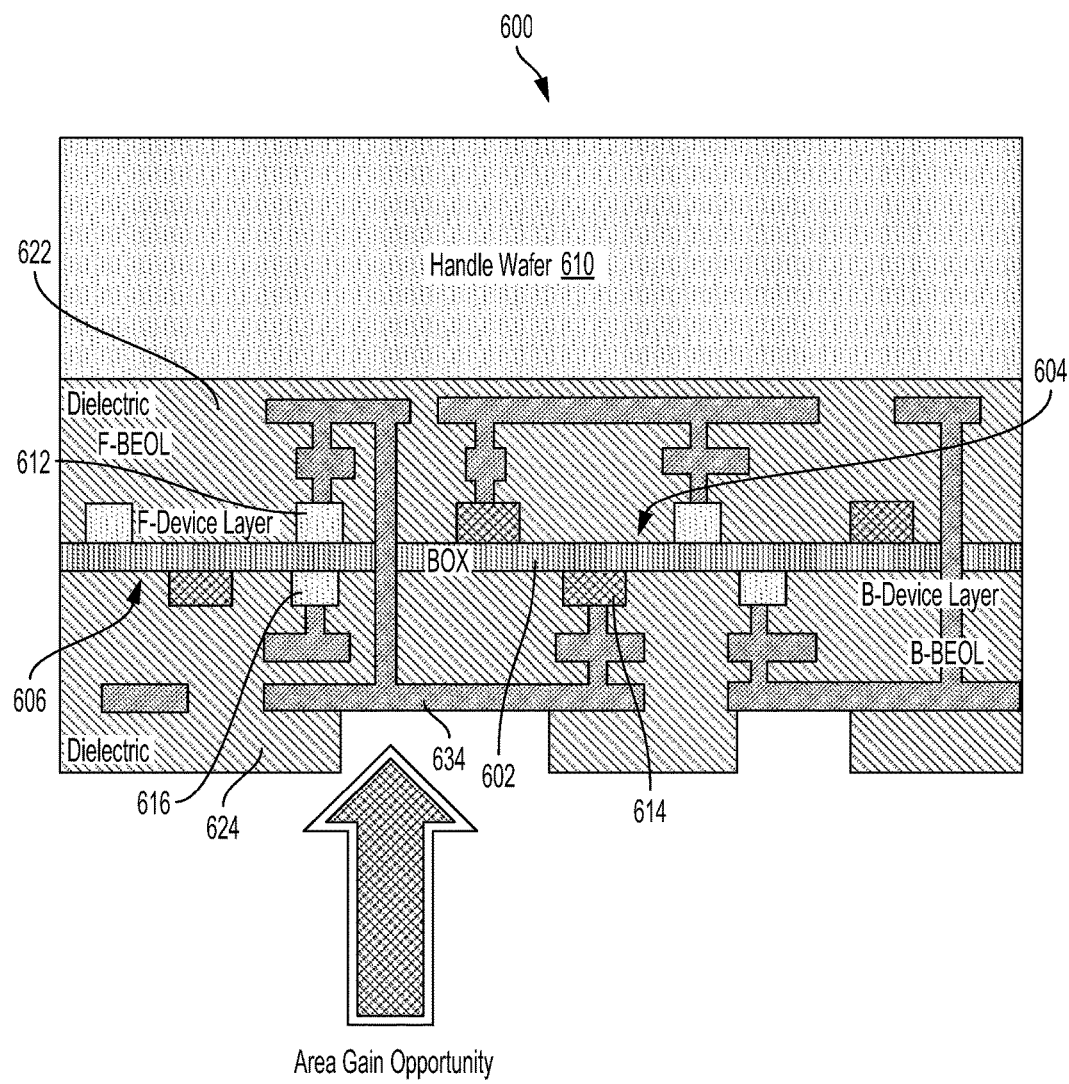
FIG. 6 illustrates a dual-sided device having contacts for connecting semiconductor devices on two sides of a buried oxide (BOX) layer according to aspects of the present disclosure.

FIG. 6 illustrates a dual-sided active device 600 having contacts for electrically coupling active devices on a front-side and a backside of an isolation layer. The dual-sided active device 600 includes an isolation layer 602 (e.g., a buried oxide (BOX) layer), and the isolation layer 602 includes a front-side 604 and a backside 606. Devices, such as the dual-sided active device 600, having active devices on the front-side 604 and the backside 606 of the isolation layer 602, may further include one or more dielectric layers. For example, the dual-sided active device 600 includes a front-side dielectric layer 622 and a backside dielectric layer 624. The dual-sided active device 600 includes a front-side active device 612 located on the front-side 604 of the isolation layer 602. The dual-sided active device 600 further includes a first backside active device 614 and a second backside active device 616 located on the backside 606 of the isolation layer 602. In addition, a handle substrate 610 (e.g., a semiconductor wafer) is coupled to the front-side dielectric layer 622.

According to aspects of the present disclosure, the handle substrate 610 may be composed of a semiconductor material, such as silicon. In this configuration, the handle substrate 610 may include at least one other active device. Alternatively, the handle substrate 610 may be a passive substrate to further improve harmonics by reducing parasitic capacitance. In this configuration, the handle substrate 610 may include at least one other passive device. As described herein, the term "passive substrate" may refer to a substrate of a diced wafer or panel, or may refer to the substrate of a wafer/panel that is not diced. In one configuration, the passive substrate is comprised of glass, air, quartz, sapphire, high-resistivity silicon, or other like passive material. The passive substrate may also be a coreless substrate.

As described herein, the front-side of the dual-sided active device 600 that is between the handle substrate 610 and the isolation layer 602 is referred to as the front-side device layer (F-device layer) of the dual-sided active device 600. The opposite side of the front-side device layer, which includes first backside active device 614 and the second backside active device 616, is referred to as the backside device layer (B-device layer). Accordingly, the dual-sided active device 600 may include front-side MEOL/BEOL layers (F-MEOL/F-BEOL) that are formed on the front-side device layer and backside MEOL/BEOL layers (B-MEOL/B-BEOL) that are formed on the backside device layer.

Active devices of the dual-sided active device 600 may be coupled to conductive structures (e.g., contacts, pads, vias, interconnects, etc.) that may enable other devices to be coupled to the active devices. For example, the front-side active device 612 is coupled to a metallization structure 634 and the first backside active device 614 is coupled to the metallization structure 634. In particular examples, the metallization structure 634 may traverse the isolation layer 602 of the dual-sided active device 600, enabling electrical connections to an active device from either side of the isolation layer 602. For example, the metallization structure 634 (e.g., front-to-backside contacts) traverses the isolation layer 602. Thus, the metallization structure 634 may enable electrical connections between the front-side active device 612 and the first backside active device 614 from either the front-side 604 or the backside 606 of the isolation layer 602.

Nevertheless, the front-to-backside contacts connecting the front-side of active devices (e.g., the front-side active device 612) on the front-side 604 of the isolation layer 602 to the backside active devices (e.g., the first backside active device 614) on the backside 606 of the isolation layer 602 take up too much space and negate the space savings achieved by the present disclosure. Accordingly, aspects of the present disclosure are directed to mitigating the challenges associated with the extra space occupied by the front-to-backside contacts, as illustrated in FIG. 7 and corresponding process illustrated in FIGS. 8A, 8B, 8C, and 8D.

Figure 7A:
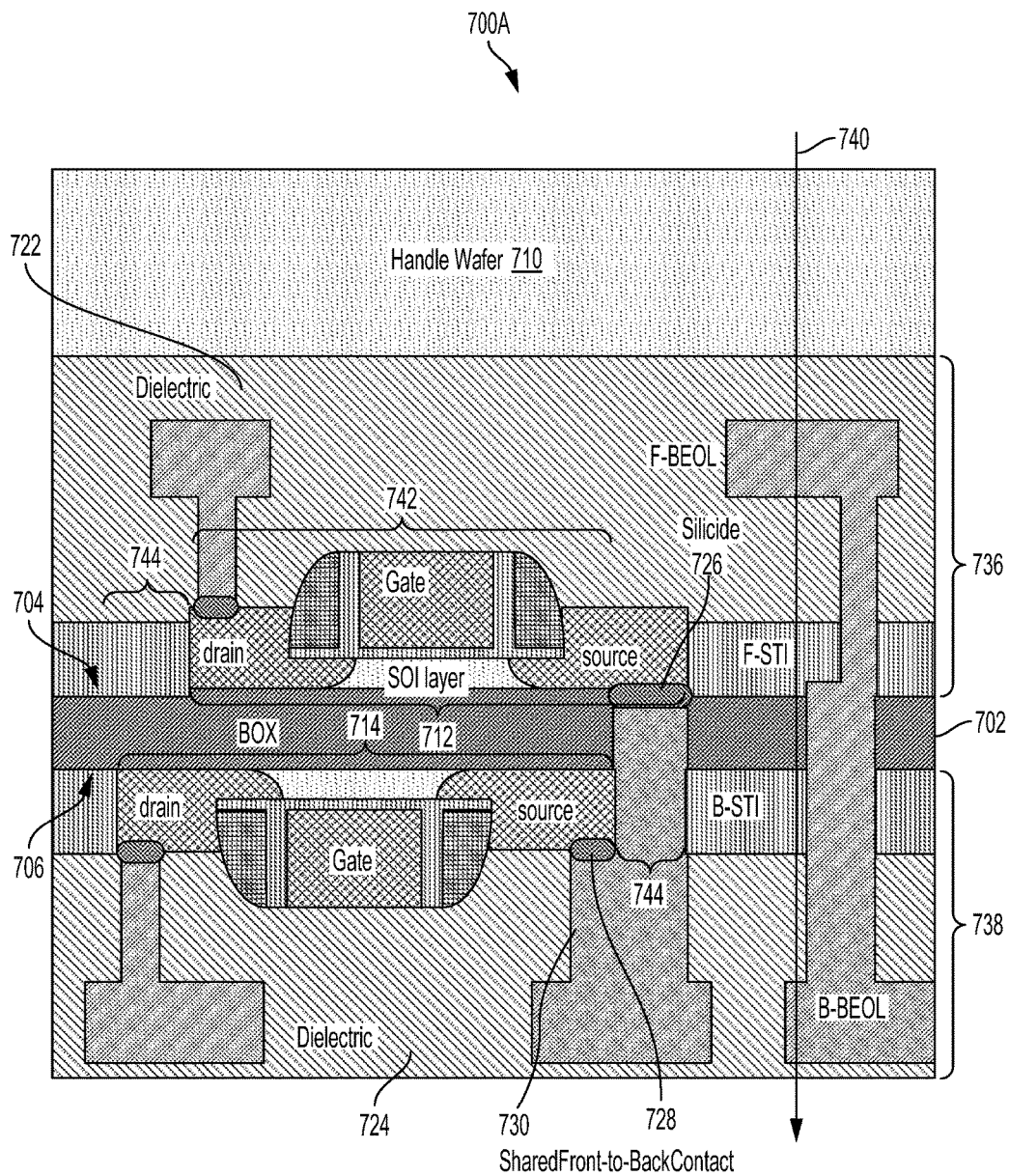
FIG. 7A illustrates a dual-sided device having shared contacts for connecting semiconductor devices on two sides of a buried oxide (BOX) layer according to aspects of the present disclosure.

FIG. 7A illustrates a dual-sided active device 700A having shared contacts for electrically coupling a front-side transistor 712 and a backside transistor 714 on a front-side surface 704 and a backside surface 706 of an isolation layer 702 (e.g., a buried oxide (BOX) layer) according to aspects of the present disclosure. The dual-sided active device 700A includes a handle substrate 710 (e.g., a handle wafer), a front-side dielectric layer 722, a backside dielectric layer 724, the isolation layer 702, the front-side transistor 712, the backside transistor 714, a shared front-to-back contact 730, and shallow trench isolation (STI) regions. The shared front-to-back contact 730 may be fabricated by depositing a front-side contact material and/or a backside contact material (e.g., copper (Cu)) to electrically couple the front-side transistor 712 and the backside transistor 714.

As described herein, the side of the dual-sided active device 700A that is between the handle substrate 710 and the isolation layer 702 is referred to as a front-side device layer (F-device layer) 736 of the dual-sided active device 700A. The opposite side of the front-side device layer 736, which includes the backside transistor 714, is referred to as a backside device layer (B-device layer) 738. Accordingly, the dual-sided active device 700A may also include front-side MEOL/BEOL layers (F-MEOL/F-BEOL) that are formed on the front-side device layer 736 and backside MEOL/BEOL layers (B-MEOL/B-BEOL) that are formed on the backside device layer 738. The dual-sided active device 700A may also include a front-side shallow trench isolation (STI) region (e.g., F-STI) formed on the front-side device layer 736 and a backside shallow trench isolation (STI) region (e.g., B-STI) formed on the backside device layer 738.

The front-side transistor 712 includes a gate, a body, and source/drain regions formed on the isolation layer 702. The backside transistor 714 also includes a gate, a body, and source/drain regions formed on the isolation layer 702. The front-side transistor 712 is on the front-side surface 704 of the isolation layer 702, and the backside transistor 714 is on the backside surface 706 of the isolation layer 702. In silicon on insulator (SOI) implementations, the isolation layer 702 is a buried oxide layer, and the body and source/drain regions are formed from an SOI layer including the front STI and back STI that are coupled to the isolation layer 702.

The dual-sided active device 700A also includes middle-end-of-line (MEOL)/back-end-of-line (BEOL) interconnects coupled to the source/drain regions of the front-side transistor 712 and the backside transistor 714. For example, the shared contact (e.g., shared front-to-back contact) 730 is coupled to the source/drain regions of the front-side transistor 712 and the backside transistor 714 through a front-side contact 726 (e.g., a front-side silicide layer) and a first backside contact 728 (e.g., a backside silicide layer). In one aspect of the disclosure, viewing the dual-sided active device 700A in the direction of arrow 740, the front-side transistor 712 is aligned with the backside transistor 714 in a staggered orientation. In this staggered orientation, portions (e.g., 742) of the front-side transistor 712 overlap some portions of the backside transistor 714 while other portions (e.g., 744) do not overlap.

In one instance, the front-side contact 726 may be coupled (e.g., directly coupled) or connected to the source of the front-side transistor 712 on the front-side surface 704 of the isolation layer 702. For example, the front-side contact 726 may be positioned between a first surface of the source of the front-side transistor 712 and the shared front-to-back contact 730 so that one or more portions of the front-side contact 726 is in contact with the isolation layer 702.

The first backside contact 728 may be coupled (e.g., directly coupled) or connected to the source of the backside transistor 714 on the backside surface 706 of the isolation layer 702. For example, the first backside contact 728 may be positioned between a surface of the source (e.g., opposite and separated from the isolation layer 702) of the backside transistor 714 and a portion of the shared front-to-back contact 730. In one aspect of the disclosure, sidewalls of the shared front-to-back contact 730 may be on sidewalls of the isolation layer 702, a sidewall of the source of the backside transistor 714, a sidewall of the backside STI regions, and sidewalls of the backside dielectric layer 724.

The shared front-to-back contact 730 connects or couples the source of the front-side transistor 712 and the backside transistor 714 through the front-side contact 726 and the first backside contact 728. While the description is directed to connection of the source of the front-side transistor 712 and the backside transistor 714, other connection configurations are possible. For example, the shared front-to-back contact 730 may connect the source of the front-side transistor 712 to the drain of the backside transistor 714. The shared front-to-back contact 730 may also connect or couple the gate of the front-side transistor 712 to the gate of the backside transistor 714. By connecting the front-side transistor 712 and the backside transistor 714 using the shared front-to-back contact 730, the dual-sided active device 700A achieves space savings relative to extra space occupied by the front-to-backside contacts (e.g., 634 of FIG. 6).

Figure 7B:
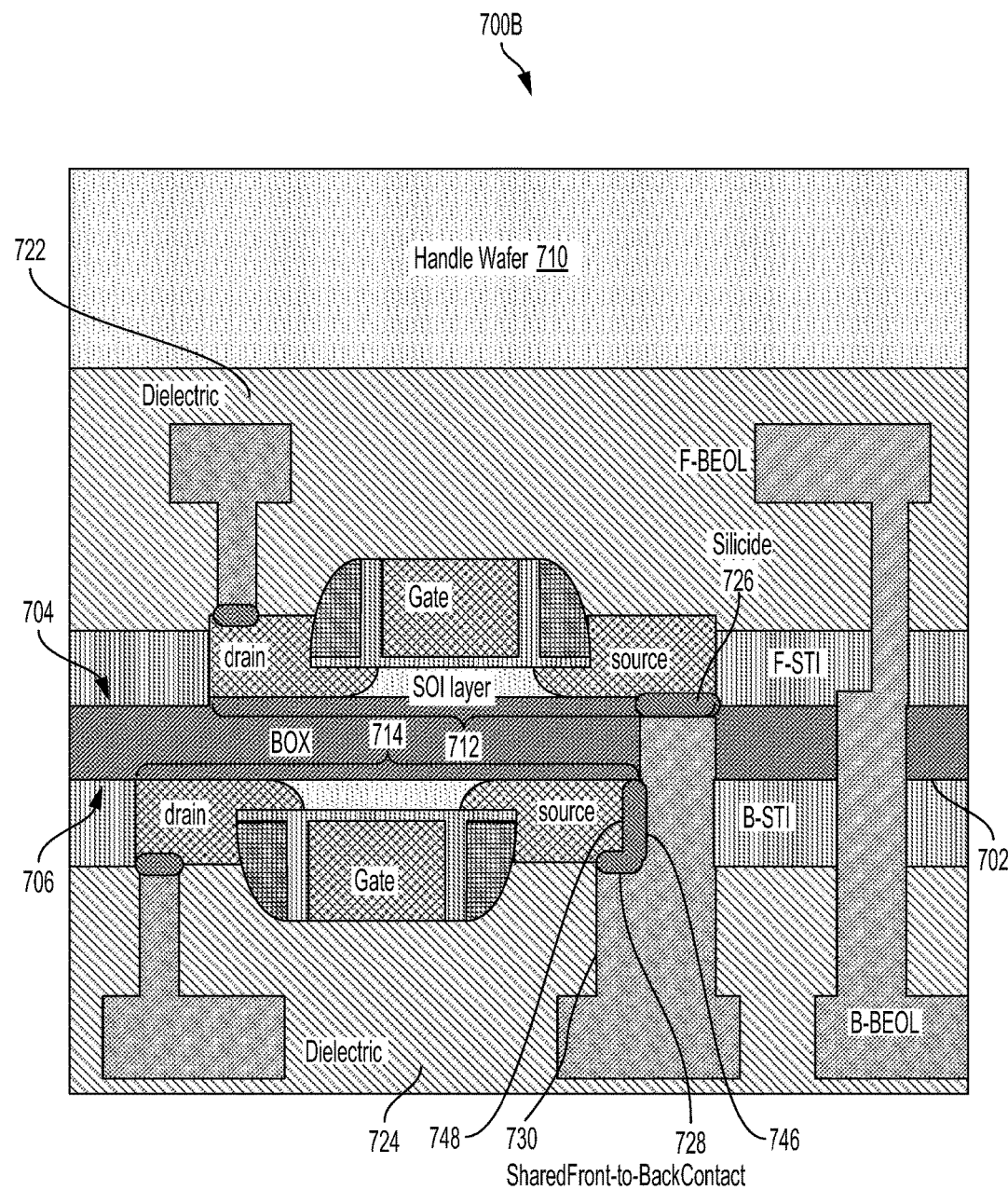
FIG. 7B illustrates another dual-sided device having shared contacts for connecting semiconductor devices on two sides of a buried oxide (BOX) layer according to aspects of the present disclosure.

FIG. 7B illustrates another dual-sided device 700B having shared contacts for connecting semiconductor devices on two sides of a buried oxide (BOX) layer according to aspects of the present disclosure. The dual-sided device 700B is similar to the dual-sided active device 700A. The difference is that the dual-sided device 700B includes a second backside contact 746. In some aspects of the present disclosure, the second backside contact 746 is coupled (e.g., directly coupled) or connected to an exposed portion of a sidewall 748 of the source of the backside transistor 714 on the backside surface 706 of the isolation layer 702. For example, the second backside contact 746 may be positioned between the sidewall 748 and an exposed portion of a sidewall of the shared front-to-back contact 730.

Figure 7C:
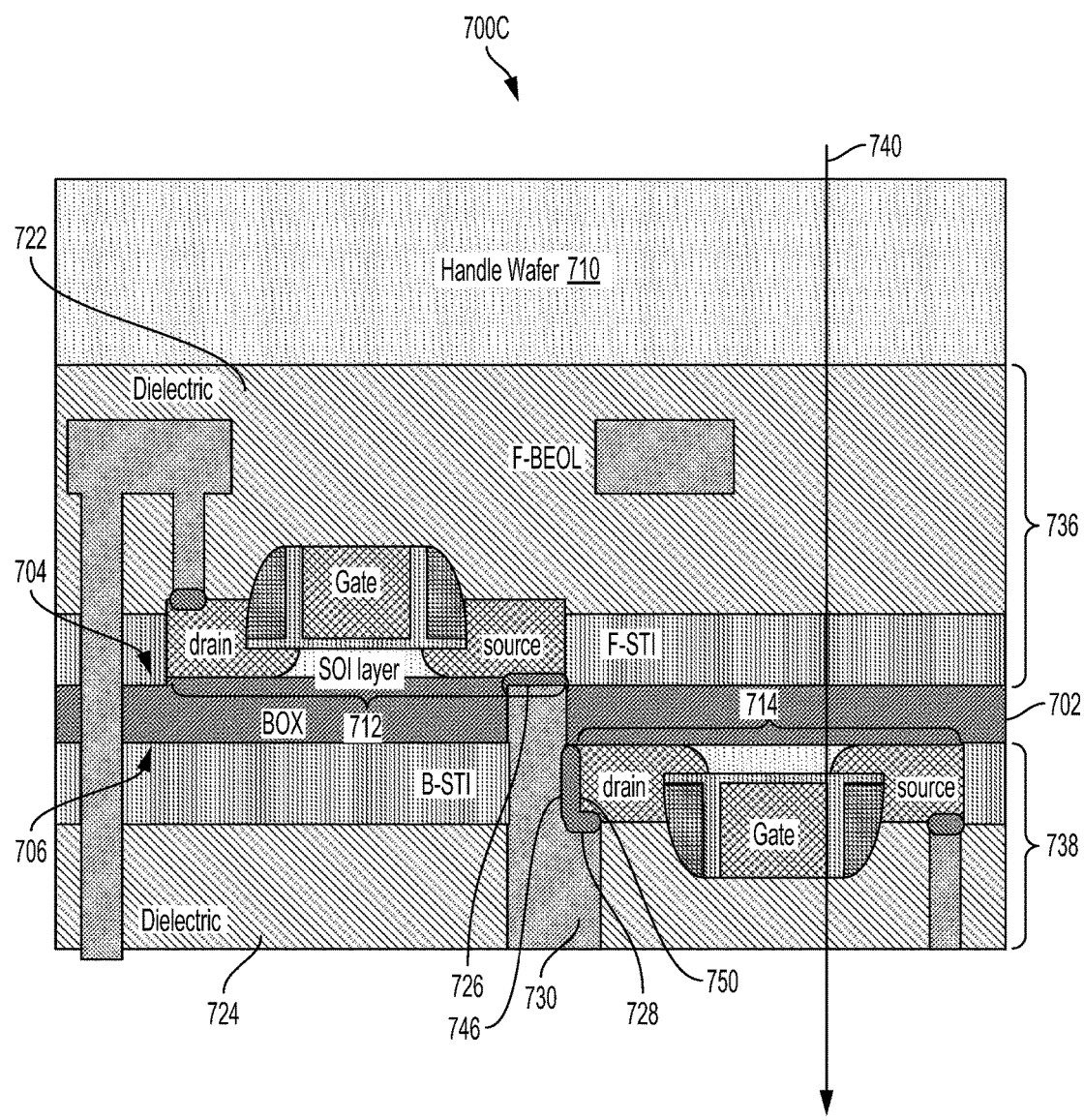
FIG. 7C illustrates yet another dual-sided device having shared contacts for connecting semiconductor devices on two sides of a buried oxide (BOX) layer according to aspects of the present disclosure.

FIG. 7C illustrates yet another dual-sided device 700C having shared contacts for connecting semiconductor devices on two sides of a buried oxide (BOX) layer according to aspects of the present disclosure. The dual-sided device 700C is similar to the dual-sided active device 700A. The difference is in the alignment of the front-side transistor 712 and the backside transistor 714. Viewing the dual-sided device 700C in the direction of arrow 740, the alignment of the front-side transistor 712 and the backside transistor 714 is staggered such that the front-side transistor 712 does not overlap the backside transistor 714. This configuration may reduce transistor coupling. In addition, the second backside contact 746 is coupled (e.g., directly coupled) or connected to a sidewall 750 of the drain of the backside transistor 714 on the backside surface 706 of the isolation layer 702. For example, the second backside contact 746 may be positioned between the sidewall 750 and a portion of a sidewall of the shared front-to-back contact 730.

While the description is directed to connection of the source of the front-side transistor 712 and the drain of the backside transistor 714, other connection configurations are possible. For example, the shared front-to-back contact 730 may connect the source of the front-side transistor 712 to the source of the backside transistor 714.

According to some aspects of the present disclosure, a contact process (e.g., shared contact process) for dual side processing for connecting transistors with minimal area loss is described, as illustrated in FIGS. 8A, 8B, 8C, and 8D. The process is directed to connecting the first set of devices (e.g., transistors) on one side of the BOX layer to the second set of devices on an opposite side of the BOX layer with minimal area loss. The shared contact process is the same up to FIG. 4F of the first fabrication process for a dual-sided device or up to FIG. 5F of the second fabrication process for the dual-sided device. For example, FIGS. 8A, 8B, 8C, and 8D are process steps following the process steps of FIG. 4F or FIG. 5F for forming the shared contact for connecting semiconductor devices on two sides of a buried oxide (BOX) layer. For example, the process steps of FIGS. 8A, 8B, 8C, and 8D correspond to the middle-end-of-line (MEOL) processing where access to the semiconductor devices (e.g., active devices), formed during a front-end-of-line (FEOL) process is provided. The MEOL processing provides contacts (including the shared contacts) between the gates and source/drain regions of the active devices and back-end-of-line (BEOL) interconnect layers (e.g., M1, M2, etc.)

FIGS. 8A, 8B, 8C, and 8D are diagrams illustrating stages of a first method of fabricating shared contacts for connecting semiconductor devices on two sides of a buried oxide (BOX) layer according to aspects of the present disclosure. For illustrative purposes, some of the labelling and numbering of the devices and features of FIGS. 8A, 8B, 8C, and 8D are similar to those of the FIGS. 7A, 7B and 7C.

Figure 8A:
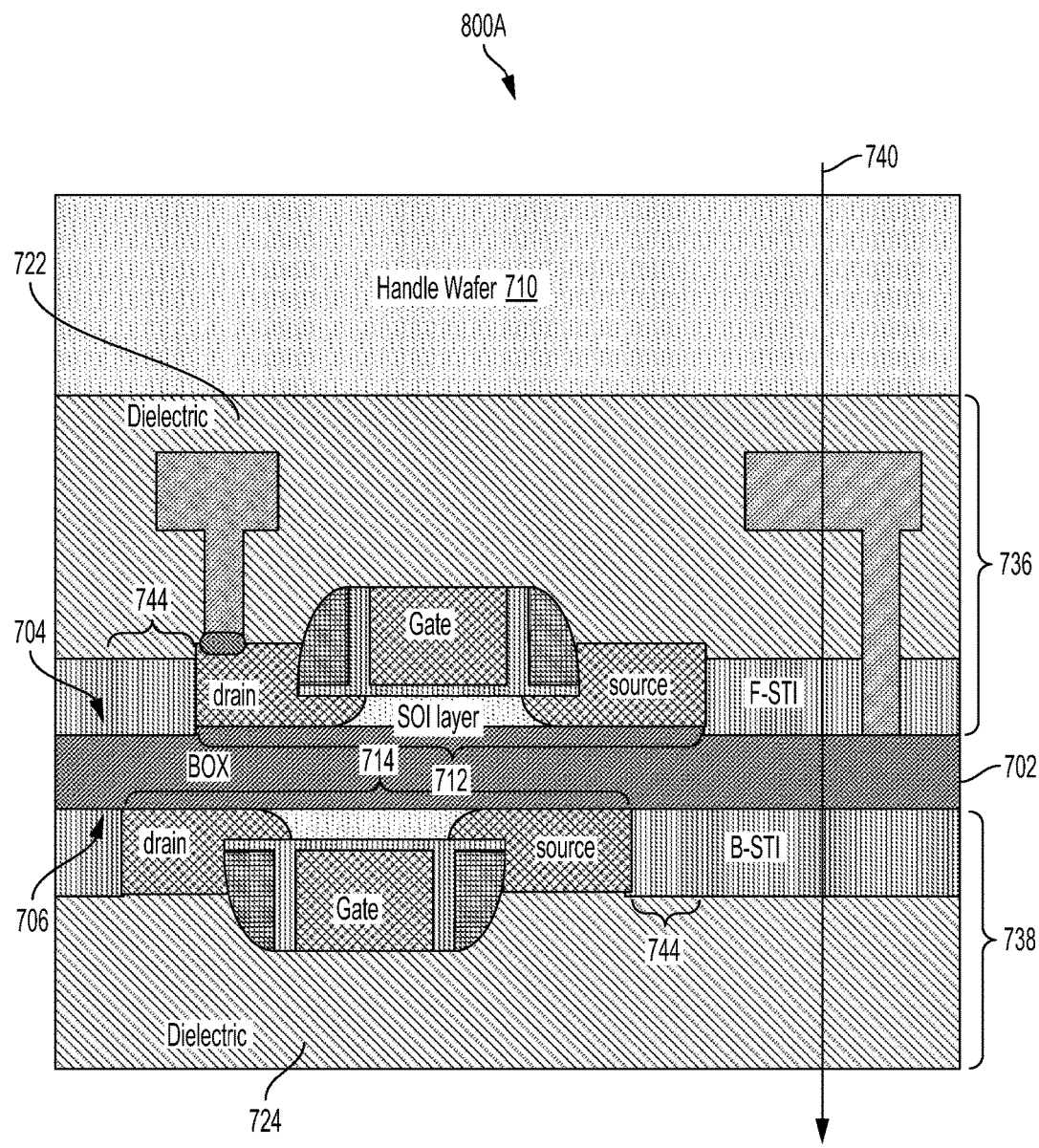
FIGS. 8A, 8B, 8C, and 8D are diagrams illustrating stages of a first method of fabricating shared contacts for connecting semiconductor devices on two sides of a buried oxide (BOX) layer according to aspects of the present disclosure.

Referring to FIG. 8A, a first stage of the shared contact process is depicted and generally designated 800A. FIG. 8A illustrates a dielectric (e.g., inter layer dielectric (ILD)) 724 deposited on the second side 706 of the isolation layer 702. For example, the backside dielectric layer 724 is deposited on the backside STI and on the backside transistor 714.

Figure 8B:
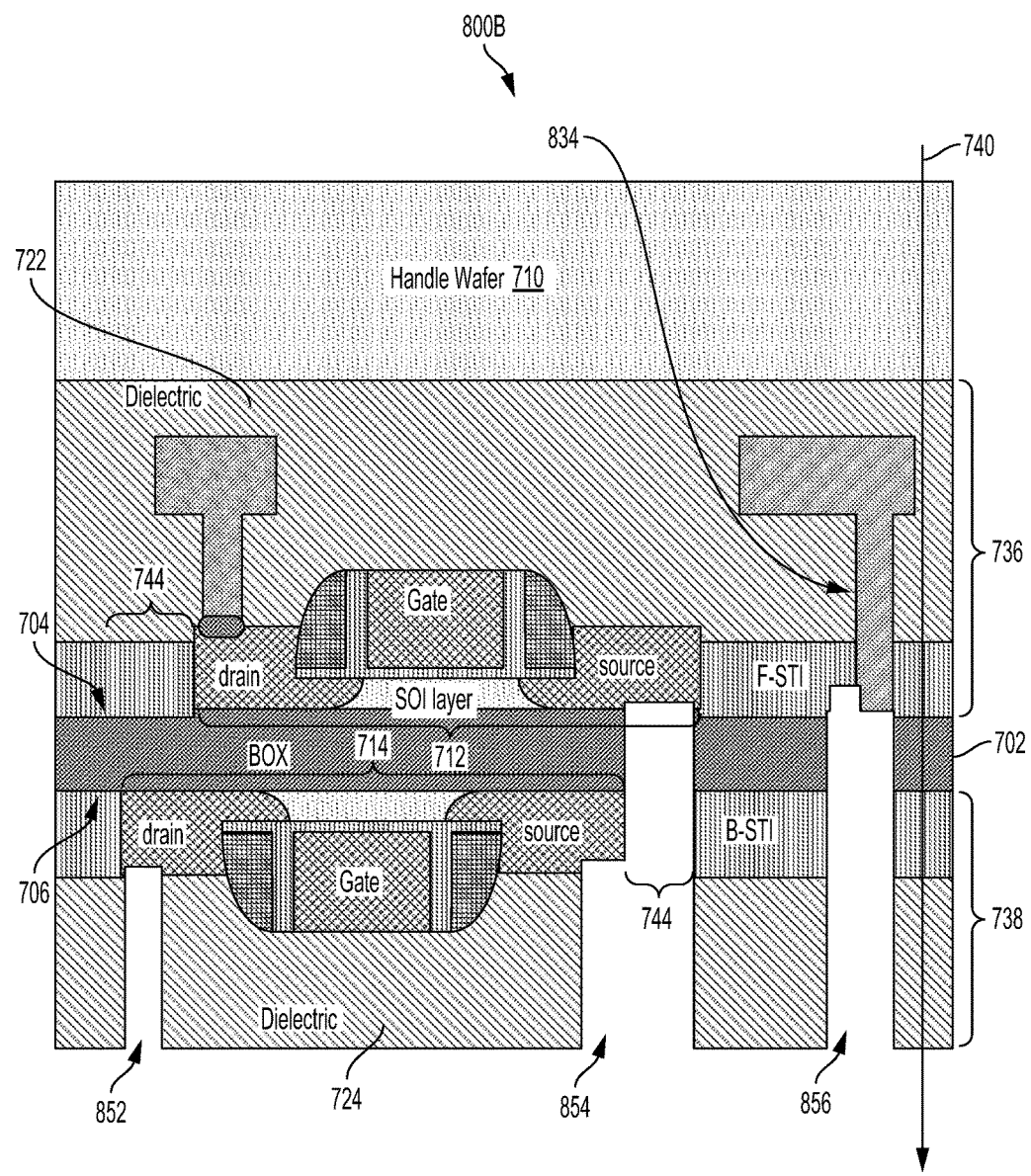

Referring to FIG. 8B, a second stage of the shared contact process is depicted and generally designated 800B. FIG. 8B illustrates punching holes, cavities or trenches 852 and 854 through the backside dielectric layer 724, through the backside STI, through the isolation layer 702 and in portions of the source and drain regions of the backside transistor 714 and in portions of the source region of the front-side transistor 712. Other holes, e.g., 856, may be punched to expose contacts 834 formed in accordance with MEOL and BEOL processes on the first side 704 of the isolation layer 702.

Punching the holes may be achieved by etching. For example, a contact etch may be adjusted to punch through different layers (e.g., through the backside STI) and the BOX layer). For example, utilization of a front-side and backside contact etch processes together enables front-to-back via formation or shared contact formation to connect the semiconductor devices on opposite sides of the isolation layer 702. Front-side etch (e.g., to form front-side MEOL contacts) and backside contact etch (e.g., to form backside MEOL contact) processes are utilized for the formation of the front-to-back via or the shared contact. The shared contact connects the front-side and backside transistors (e.g., the first and second semiconductor devices with minimal area loss.

In some implementations, a single backside contact etch process is sufficient to form the backside MEOL contact. In some implementations, the isolation layer 702 and the source and drain (SD) layers are less than 200 nanometers in thickness. The contact etch process if designed to stop on silicon, may continue until all oxides are removed. If the front-side MEOL contact is placed on the isolation layer 702 without diffusion or a gate beneath the front-side MEOL contact, the front-side MEOL contact forms the first half of the front-to-back via or shared contact. When the backside via is etched or trench or cavity is formed and filled with contact material to form the backside MEOL contact, the front-side MEOL contact and the backside MEOL contact are merged to form the shared contact.

Figure 8C:
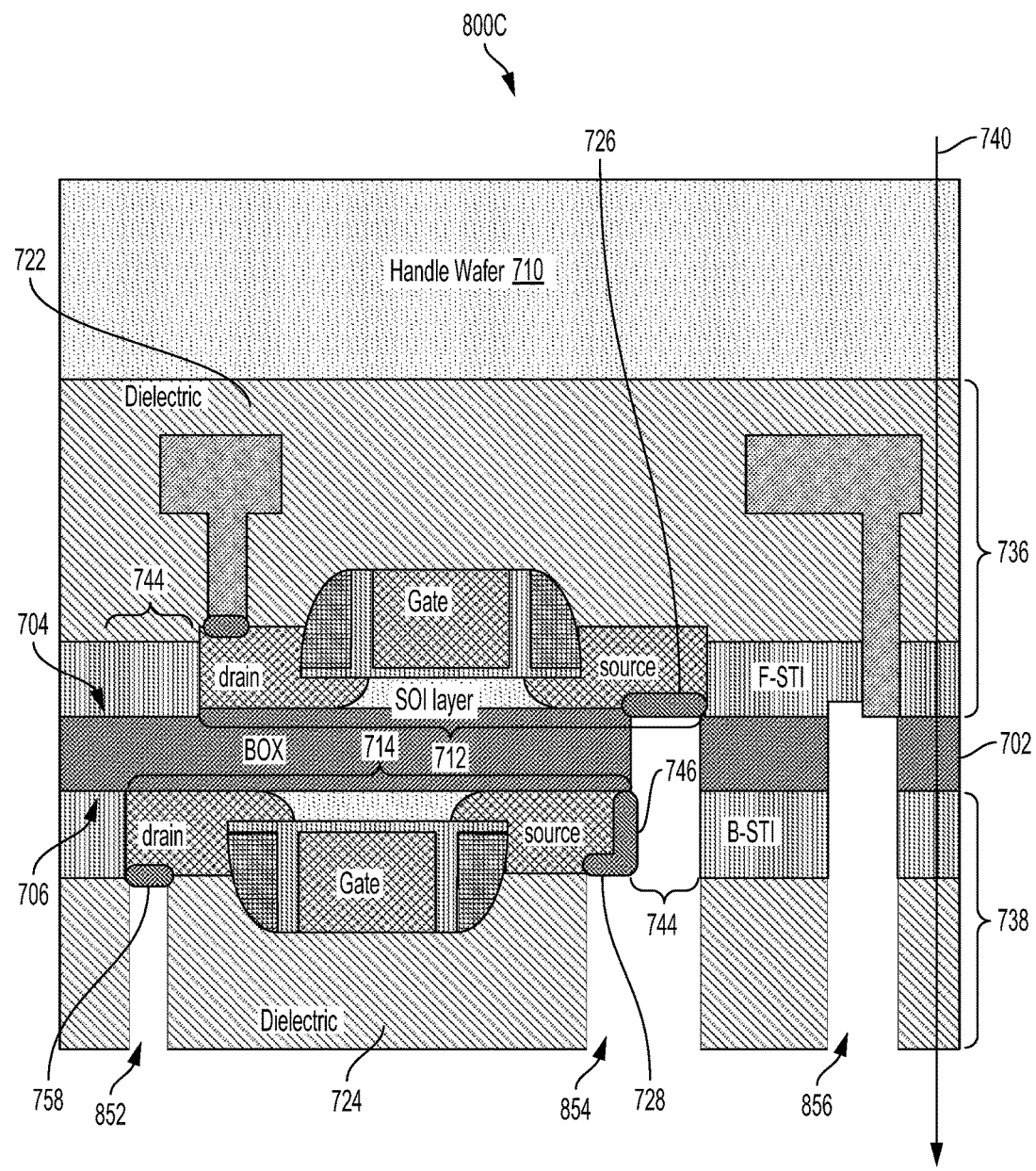

Referring to FIG. 8C, a third stage of the shared contact process is depicted and generally designated 800C. FIG. 8C illustrates a silicidation process where silicide material (e.g., NiPtSi or any another alloy) is deposited and silicidation anneals (soak or laser) are performed. The silicidation process yields silicide layers (e.g., 726, 728, 746 and 758). The silicidation process, however, is optional.

Figure 8D:
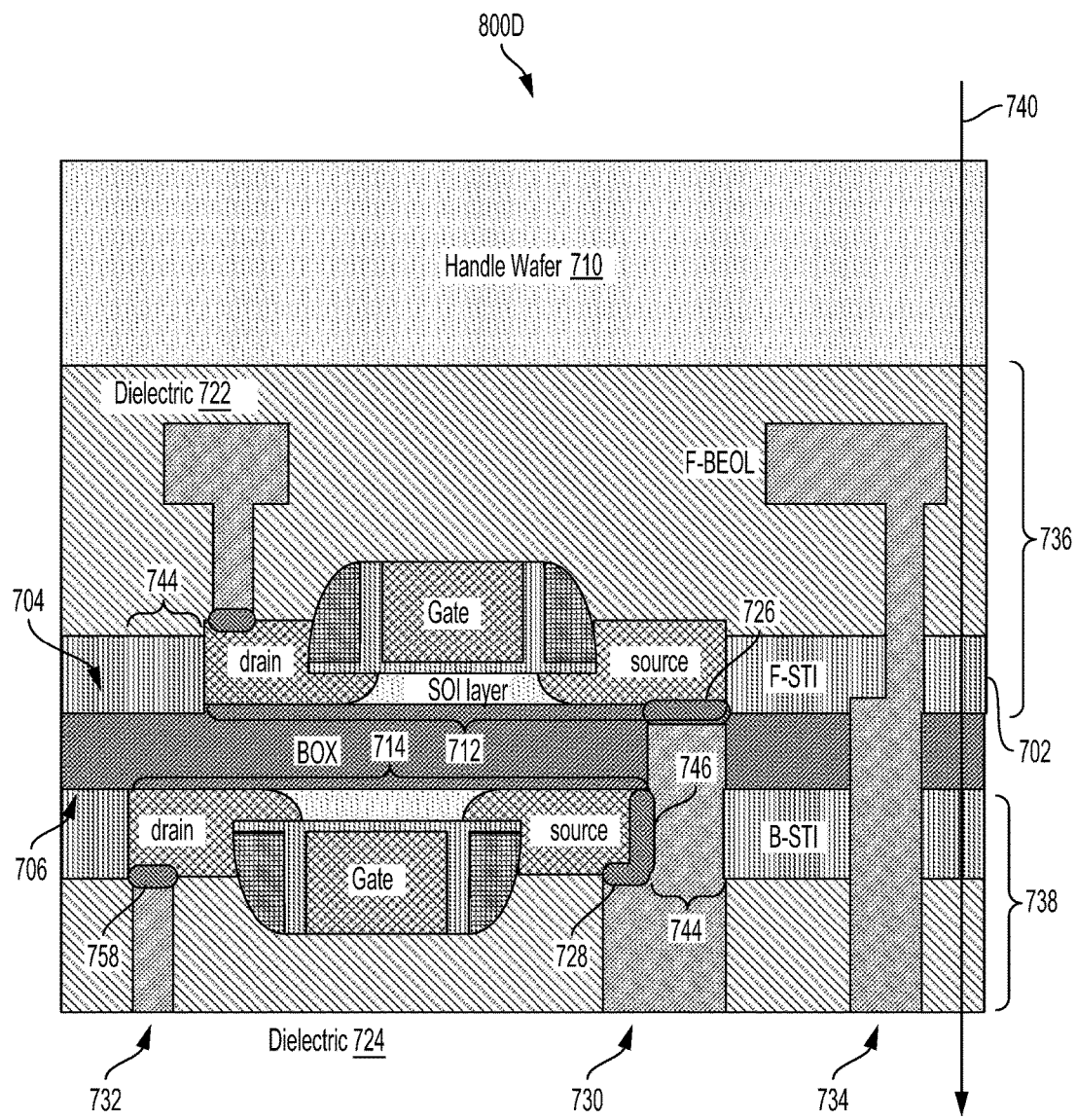

Referring to FIG. 8D, a fourth stage of the shared contact process is depicted and generally designated 800D. FIG. 8D illustrates depositing of contact material in the trenches 852, 854 and 856. For example, a contact liner and tungsten material is deposited in the holes followed by a chemical mechanical polishing (CMP.) The deposition yields the shared front-to-back contact 730 as well as other contacts including contacts 732 and 734.

Figure 9:
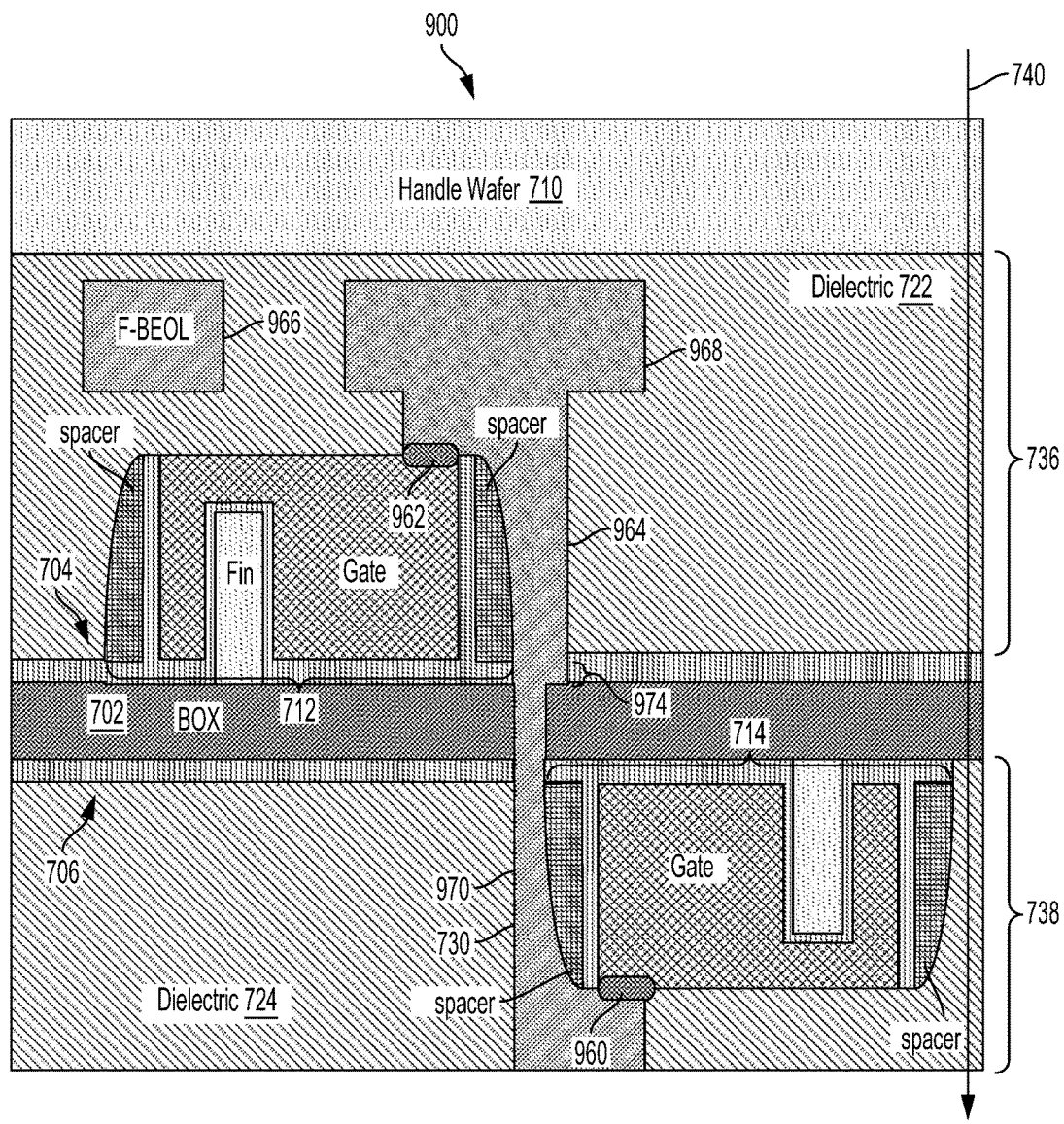
FIG. 9 illustrates a dual-sided device having shared contacts for connecting gates of semiconductor devices on two sides of a buried oxide (BOX) layer according to aspects of the present disclosure.

Some aspects of the present disclosure are directed to shared contacts that connect or couple the gate of the first semiconductor device to the gate of the second semiconductor device, as shown in FIG. 9 and the corresponding process illustrated in FIGS. 10A, 10B, 10C, and 10D.

FIG. 9 illustrates a dual-sided active device 900 having shared contacts for electrically coupling gates of active devices on a front-side surface 704 and a backside surface 706 of an isolation layer 702 (e.g., a buried oxide (BOX) layer) according to aspects of the present disclosure. For illustrative purposes, some of the labelling and numbering of the devices and features of FIG. 9 are similar to those of FIGS. 7A, 7B and 7C. The dual-sided active device 900 includes the handle substrate 710, the front-side dielectric layer 722, the backside dielectric layer 724, the isolation layer 702, the front-side transistor 712, the backside transistor 714, and the shared front-to-back contact 730. In one aspect of the disclosure, the front-side transistor 712 and/or the backside transistor 714 may be FinFET devices or ultra-thin SOI layer process devices. With the FinFET devices or ultra-thin SOI layer process devices, STI is not needed. Because the STI is not needed, the amount of etching (e.g., to form cavities) is reduced.

The dual-sided active device 900 may include front-side MEOL/BEOL layers (F-MEOL/F-BEOL) that are formed on the front-side device layer and backside MEOL/BEOL layers (B-MEOL/B-BEOL) that are formed on the backside device layer. For example, the front-side MEOL contact 964 may be included in the front-side MEOL layers. The front-side BEOL contacts 966 and 968 are included in the front-side BEOL layers. The backside MEOL contact 970 may be included in the backside MEOL layers. In this case, the combination of the front-side MEOL contact 964 and the backside MEOL contact 970 form the shared front-to-back contact 730.

The MEOL/BEOL interconnects or contacts are coupled to the gates of the front-side transistor 712 and the backside transistor 714. For example, the shared contact (e.g., shared front-to-back contact) 730 is coupled to the gate regions of the front-side transistor 712 and the backside transistor 714 through a front-side contact 962 (e.g., a front-side silicide layer) and a backside contact 960 (e.g., a backside silicide layer). The front-side MEOL contact 964 of the shared front-to-back contact 730 is coupled (e.g., directly coupled) or connected to the gate of the front-side transistor 712 or the front-side contact 962 that is positioned between a portion of the front-side MEOL contact 964 and the gate of the front-side transistor 712. A portion of the front-side MEOL contact 964 is on a sidewall of the front-side transistor 712. For example, the portion of the front-side MEOL contact 964 is on the spacer of the front-side transistor 712.

The front-side MEOL contact 964 is connected to the backside MEOL contact 970. The backside MEOL contact 970 of the shared front-to-back contact 730 is coupled (e.g., directly coupled) or connected to the gate of the backside transistor 714 or the backside contact 960 that is positioned between a portion of the backside MEOL contact 970 and the gate of the backside transistor 714. A portion of the backside MEOL contact 970 is on a sidewall of the backside transistor 714. For example, the portion of the backside MEOL contact 970 is on the spacer of the backside transistor 714. The shared front-to-back contact 730 is on sidewalls of the isolation layer 702. In some aspects of the disclosure, the front-side MEOL contact 964 is larger and misaligned (as shown at junction 974) to enable etching down the isolation layer 702 to form the front-to-back via or the shared front-to-back contact 730.

In one aspect of the disclosure, viewing the dual-sided active device 900 in the direction of arrow 740, the front-side transistor 712 is aligned with the backside transistor 714 in a staggered orientation. In this staggered orientation, the front-side transistor 712 does not overlap the backside transistor 714.

FIGS. 10A, 10B, 10C, and 10D are diagrams illustrating stages of a first method of fabricating shared contacts for connecting gates of semiconductor devices on two sides of a buried oxide (BOX) layer according to aspects of the present disclosure. For illustrative purposes, some of the labelling and numbering of the devices and features of FIGS. 10A, 10B, 10C, and 10D are similar to those of the FIGS. 7A, 7B, 7C and 9.

Figure 10A:
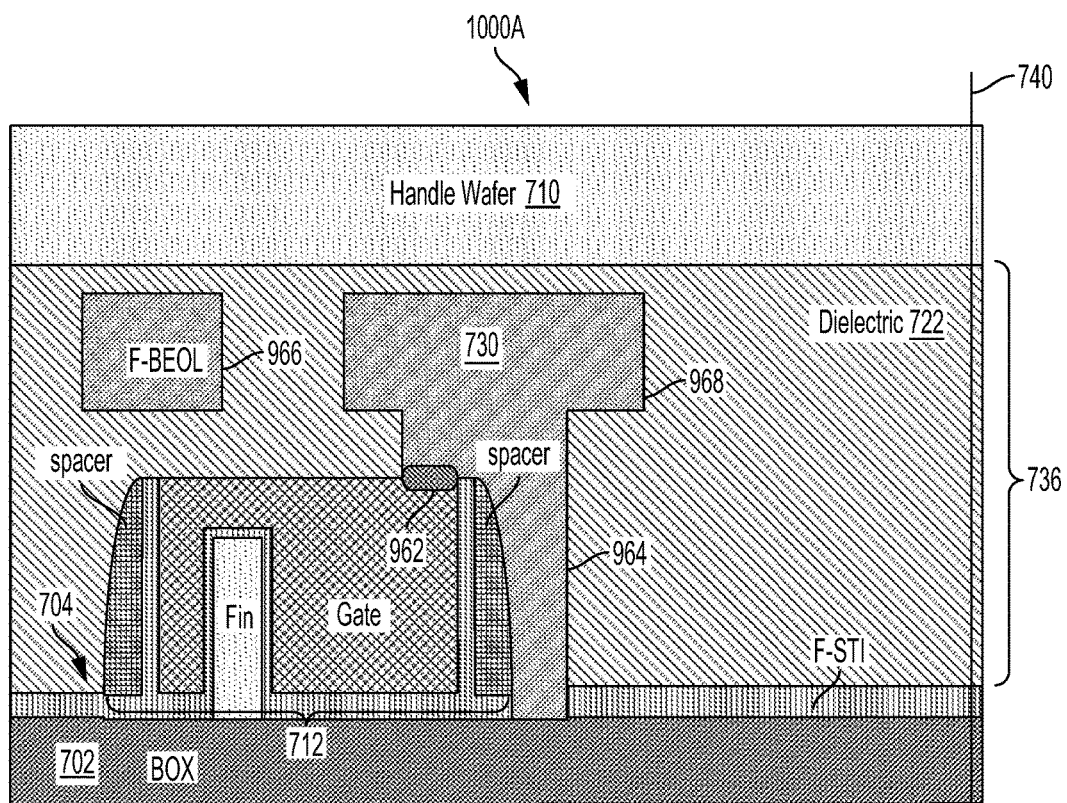
FIGS. 10A, 10B, 10C, and 10D are diagrams illustrating stages of a first method of fabricating shared contacts for connecting gates of semiconductor devices on two sides of a buried oxide (BOX) layer according to aspects of the present disclosure.

Referring to FIG. 10A, a first stage of the shared contact process is depicted and generally designated 1000A. FIG. 10A illustrates the first stage that includes formation of the front-side device layer (F-device layer) 736 of the dual-sided device 900A that is between the handle substrate 710 and the isolation layer 702. In the first stage, the front-side MEOL contact 964 is formed, and is positioned between the front-side BEOL contacts 968 and the isolation layer 702. For example, the front-side MEOL contact 964 of the shared front-to-back contact 730 is coupled (e.g., directly coupled) or connected to the gate of the front-side transistor 712 or the front-side contact 962 that is positioned between a portion of the front-side MEOL contact 964 and the gate of the front-side transistor 712. A portion of the front-side MEOL contact 964 is on a sidewall of the front-side transistor 712. For example, the portion of the front-side MEOL contact 964 is on the spacer of the front-side transistor 712.

Figure 10B:
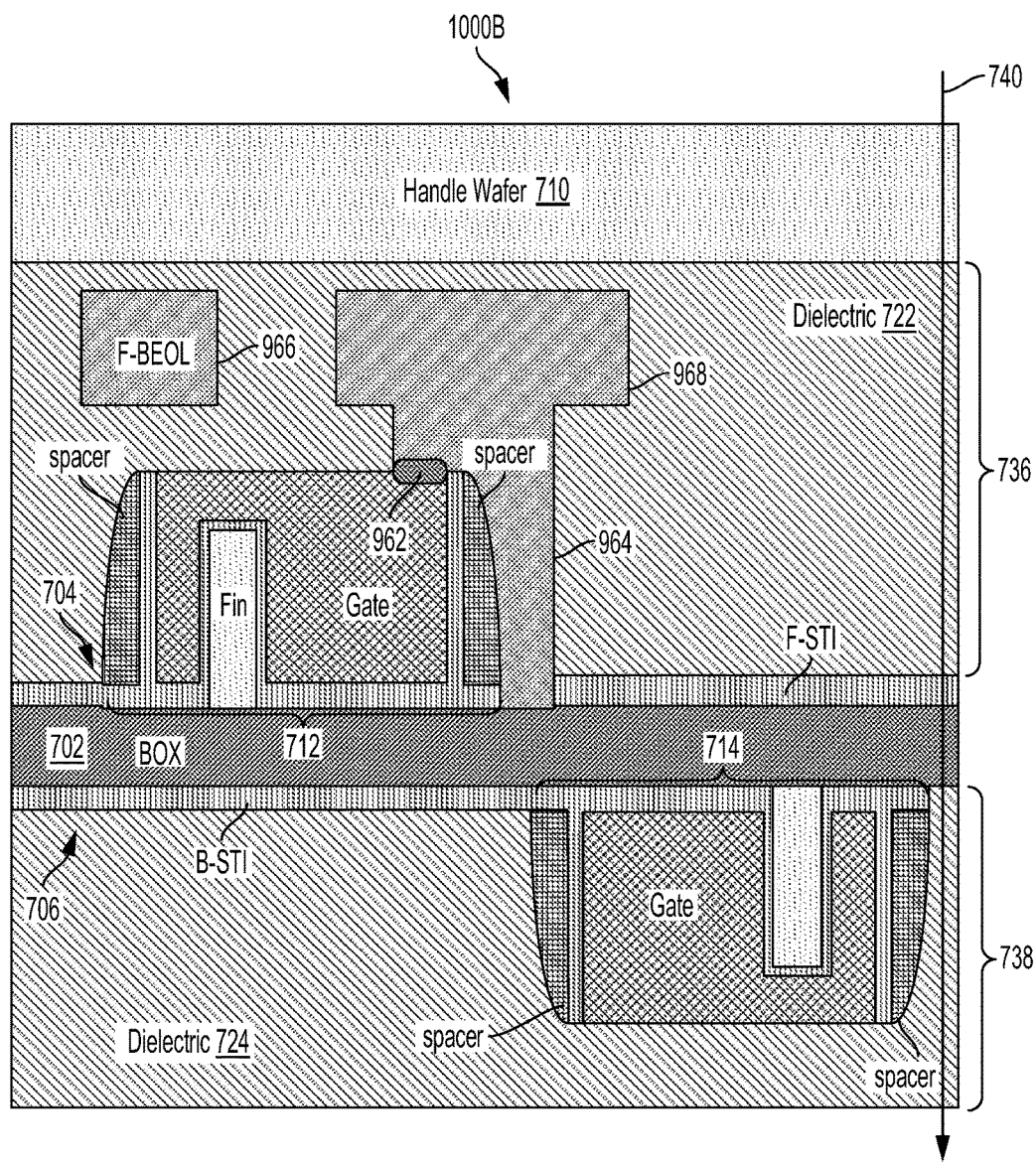

Referring to FIG. 10B, a second stage of the shared contact process is depicted and generally designated 1000B. The second stage 1000B may follow the first stage 1000A. In between the second stage 1000B and the first stage 1000A, additional devices, such as the backside transistor 714 may be formed on the second side 706 of the isolation layer 702. In addition, a dielectric (e.g., inter layer dielectric (ILD)) 724 is deposited on the second side 706 of the isolation layer 702. For example, the backside dielectric layer 724 is deposited on the backside STI and on the backside transistor 714.

Figure 10C:
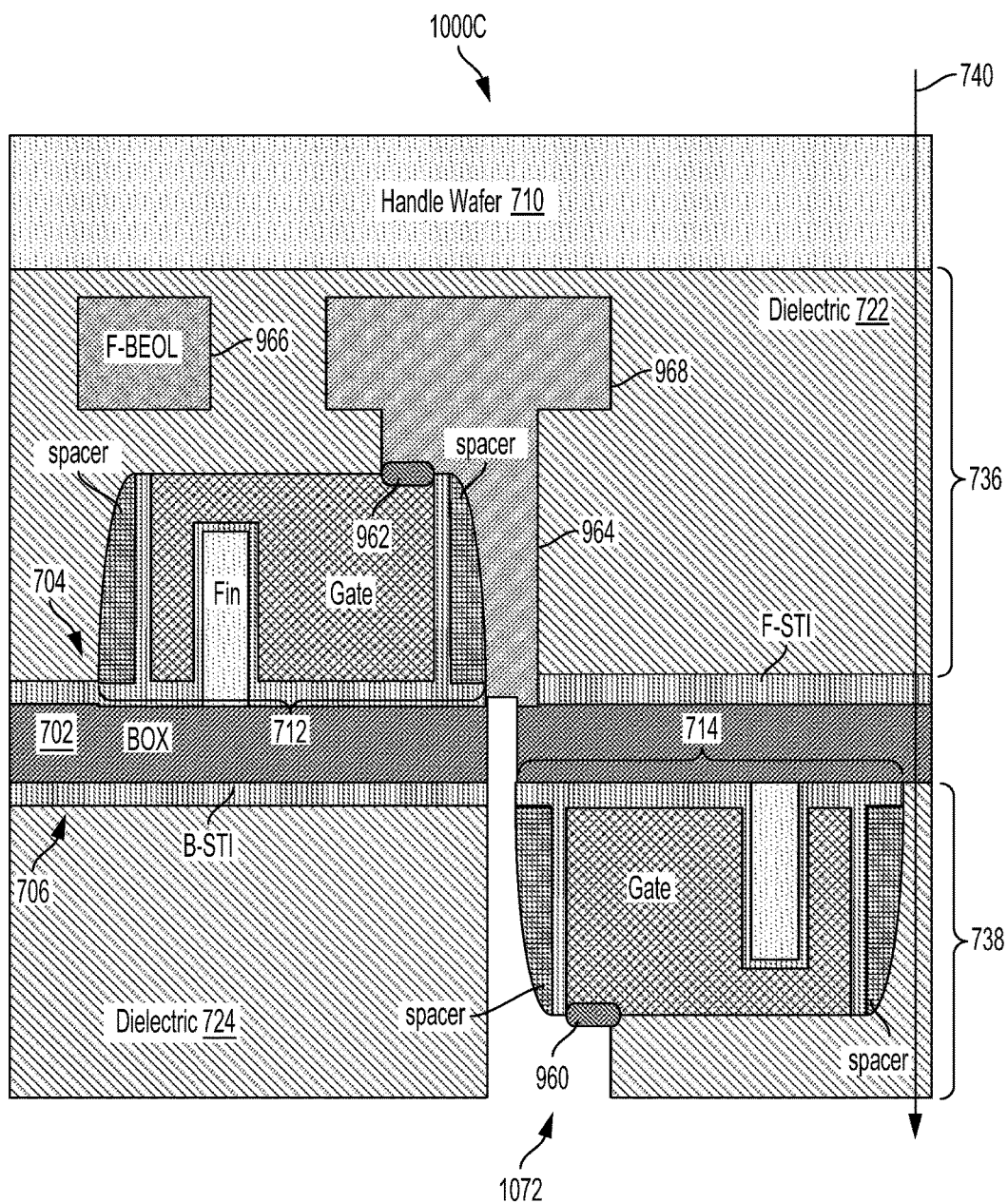

Referring to FIG. 10C, a third stage of the shared contact process is depicted and generally designated 1000C. FIG. 10C illustrates a process for opening a trench 1072 through the backside dielectric layer 724, through the backside STI, and through the isolation layer 702. This process may be similar to the process in FIG. 8B. For example, the trench 1072 may be opened to expose a portion of the front-side MEOL contact 964 formed in accordance with MEOL processes on the first side 704 of the isolation layer 702. Punching the holes may be achieved by etching. A contact etch may be adjusted to punch through different layers (e.g., through the backside STI and the isolation layer 702). For example, utilization of front-side and backside contact etch processes together enables front to back via formation or shared contact formation to connect the semiconductor devices on opposite sides of the isolation layer 702.

Figure 10D:
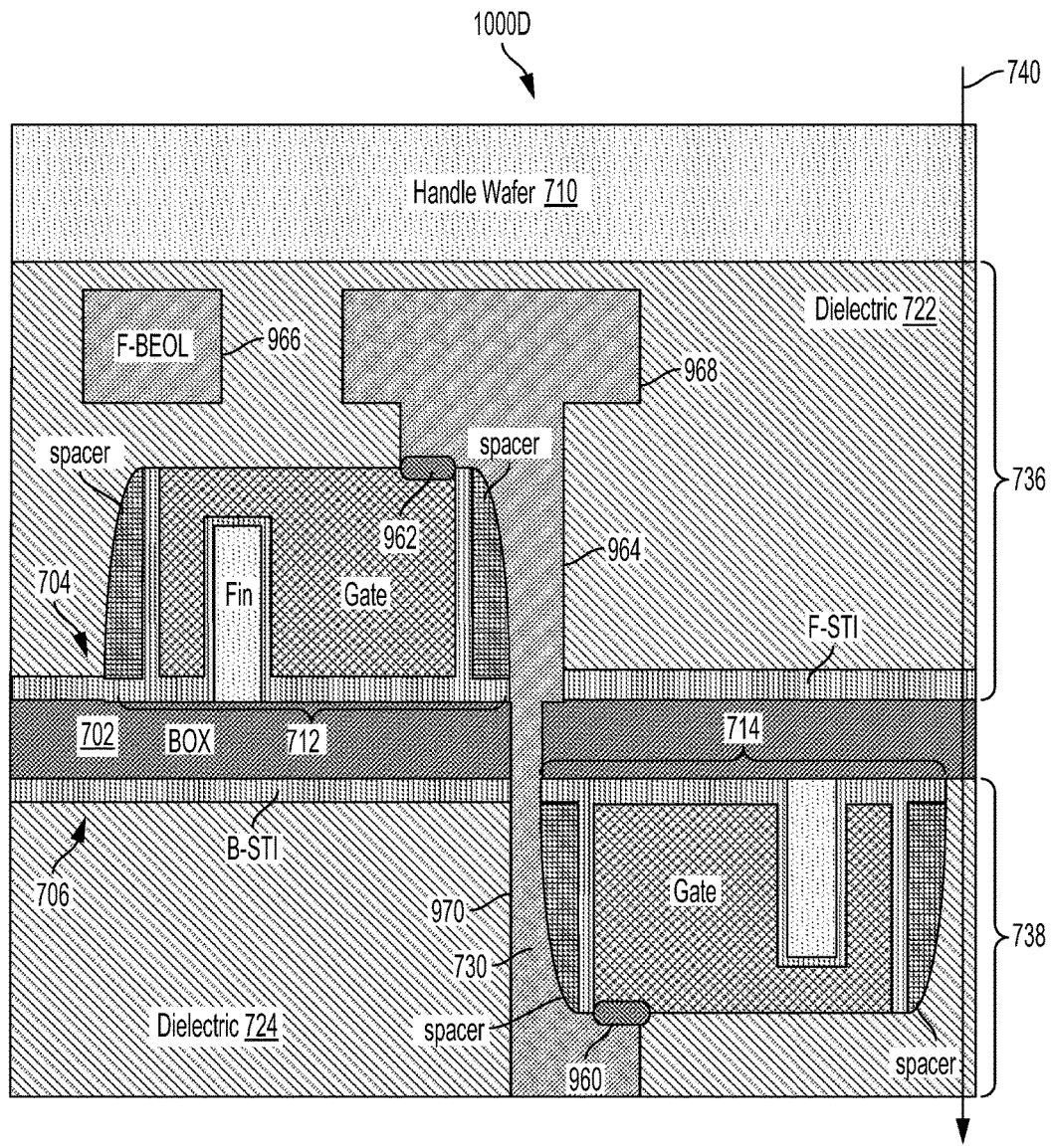

Referring to FIG. 10D, a fourth stage of the shared contact process is depicted and generally designated 1000D. FIG. 10D illustrates depositing of contact material in the trench 1072. For example, a contact liner and tungsten material are deposited in the trench 1072 followed by a chemical mechanical polishing (CMP). The deposition yields the backside MEOL contact 970, which in combination with the front-side MEOL contact 964 form the shared front-to-back contact 730 that connects the gates of the front-side transistor 712 and the backside transistor 714. If the front-side MEOL contact is placed on the BOX layer without diffusion or a gate beneath the front-side MEOL contact, the front-side MEOL contact forms the first half of the front-to-back via or shared contact. When the backside via is etched or trench or cavity is formed and filled with contact material to form the backside MEOL contact, the front-side MEOL contact and the backside MEOL contact are merged to form the shared contact.

Figure 11:
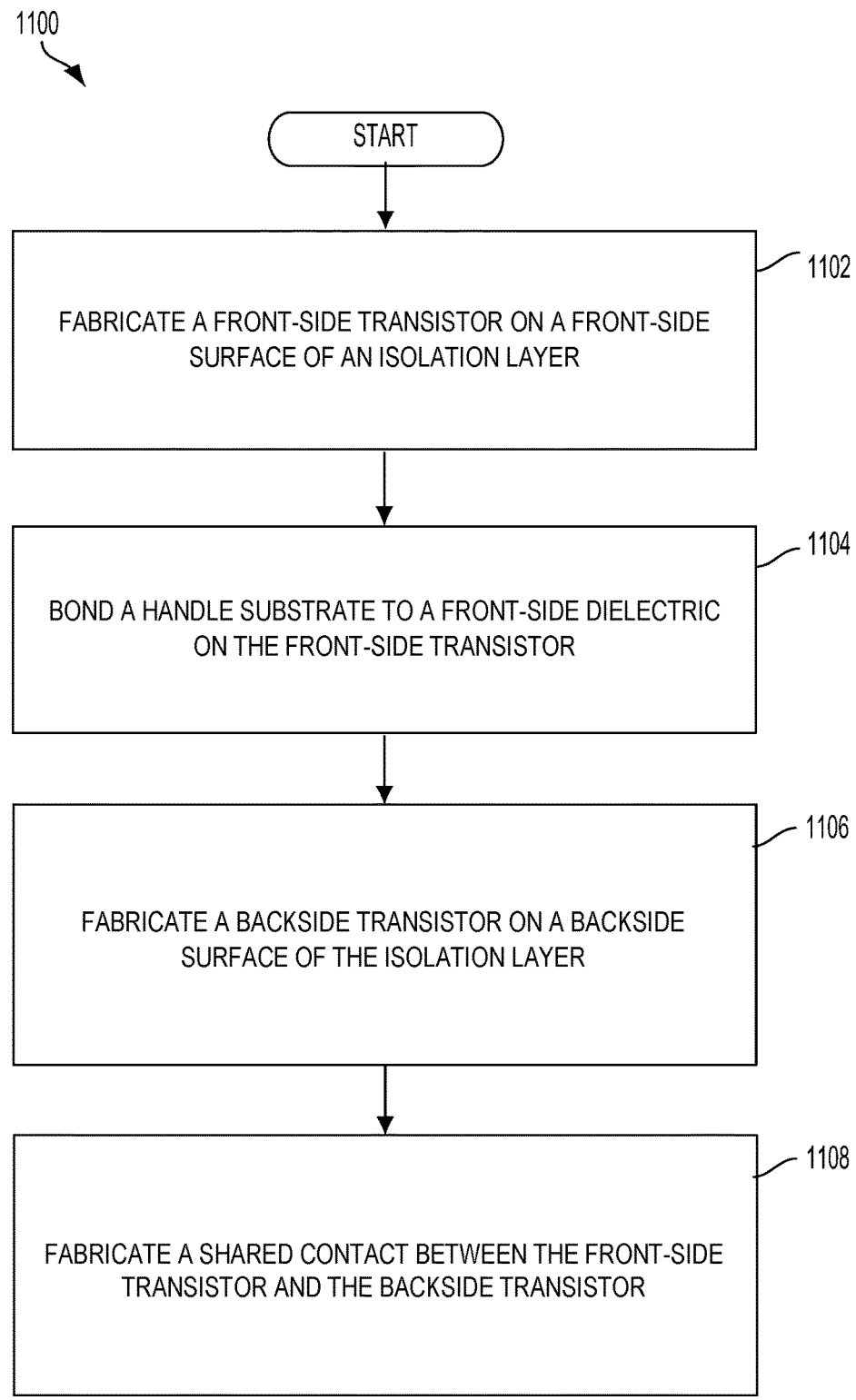
FIG. 11 is a process flow diagram illustrating a method of constructing an integrated circuit structure including an active device having backside extended source/drain/body regions according to an aspect of the present disclosure.

FIG. 11 is a process flow diagram illustrating a method 1100 of constructing an integrated circuit device, according to an aspect of the present disclosure. At block 1102, a front-side transistor is fabricated on a front-side surface of an isolation layer. For example, as shown in FIG. 7A, a front-side transistor 712 is fabricated on a front-side surface 704 of the isolation layer 702. At block 1104, a handle substrate is bonded to a front-side dielectric layer on the front-side transistor. For example, a layer transfer process is performed, in which a handle substrate 710 is bonded to a front-side dielectric layer 722, as shown in FIG. 7A. The layer transfer process also includes removal of a portion of the bulk substrate, such as the third SOI substrate layer 408, as shown in FIG. 5C. As shown in FIG. 5D, the partial removal of the third SOI substrate layer 408 exposes an etch enhancement layer 506, which is removed to expose a second SOI substrate layer 404, which may be an unprocessed layer of silicon. In this aspect of the present disclosure, fabrication of backside transistors is performed as part of a post-layer transfer process.

At block 1106, a backside transistor is fabricated on a backside surface of an isolation layer. For example, as shown in FIG. 7A, the backside transistor 714 is fabricated on the backside surface 706 of the isolation layer 702. At block 1108, a shared contact is fabricated between the front-side transistor and a backside transistor. For example, as shown in FIG. 7A, the front-to-back contact 730 is fabricated to electrically couple a source/drain region or spacer of the backside transistor 714 to the source/drain region or spacer of the front-side transistor 712.

According to a further aspect of the present disclosure, an integrated circuit device is described. The integrated circuit device includes means for electrically coupling the front-side transistor with the backside transistor. The electrically coupling means may be the front-to-back contact 730, shown in FIGS. 7A, 7B, and 7C and/or silicide layers (e.g., 726, 728 and, 746), shown in FIGS. 7A, 7B, and 7C. In another aspect, the aforementioned means may be any module or any apparatus configured to perform the functions recited by the aforementioned means.

Figure 12:
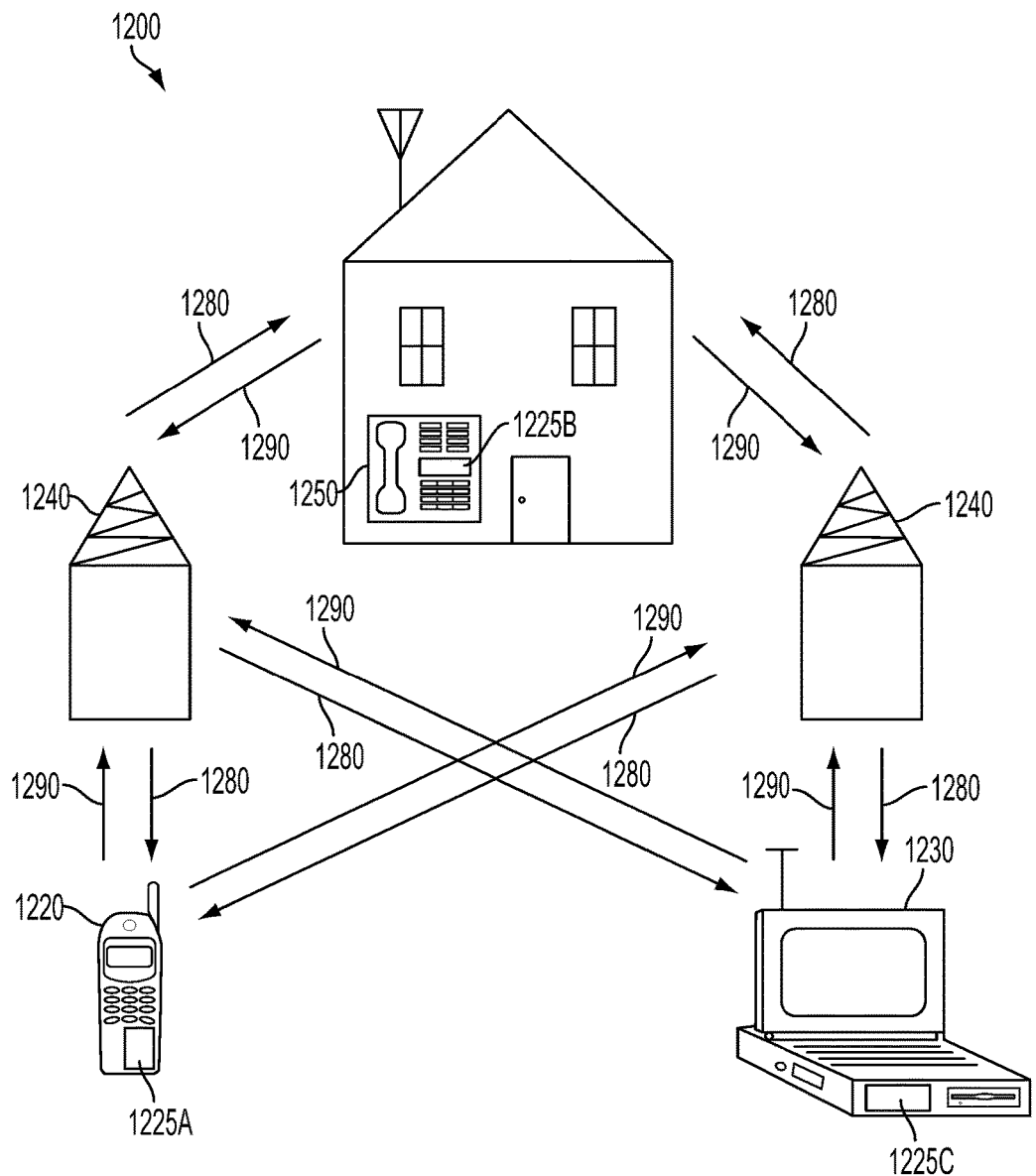
FIG. 12 is a block diagram showing an exemplary wireless communication system in which a configuration of the disclosure may be advantageously employed.

FIG. 12 is a block diagram showing an exemplary wireless communication system 1200 in which an aspect of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C, and 1225B that include the disclosed dual-sided active devices. It will be recognized that other devices may also include the disclosed dual-sided active devices, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base stations 1240.

In FIG. 12, remote unit 1220 is shown as a mobile telephone, remote unit 1230 is shown as a portable computer, and remote unit 1250 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the disclosed dual-sided active devices.

Figure 13:
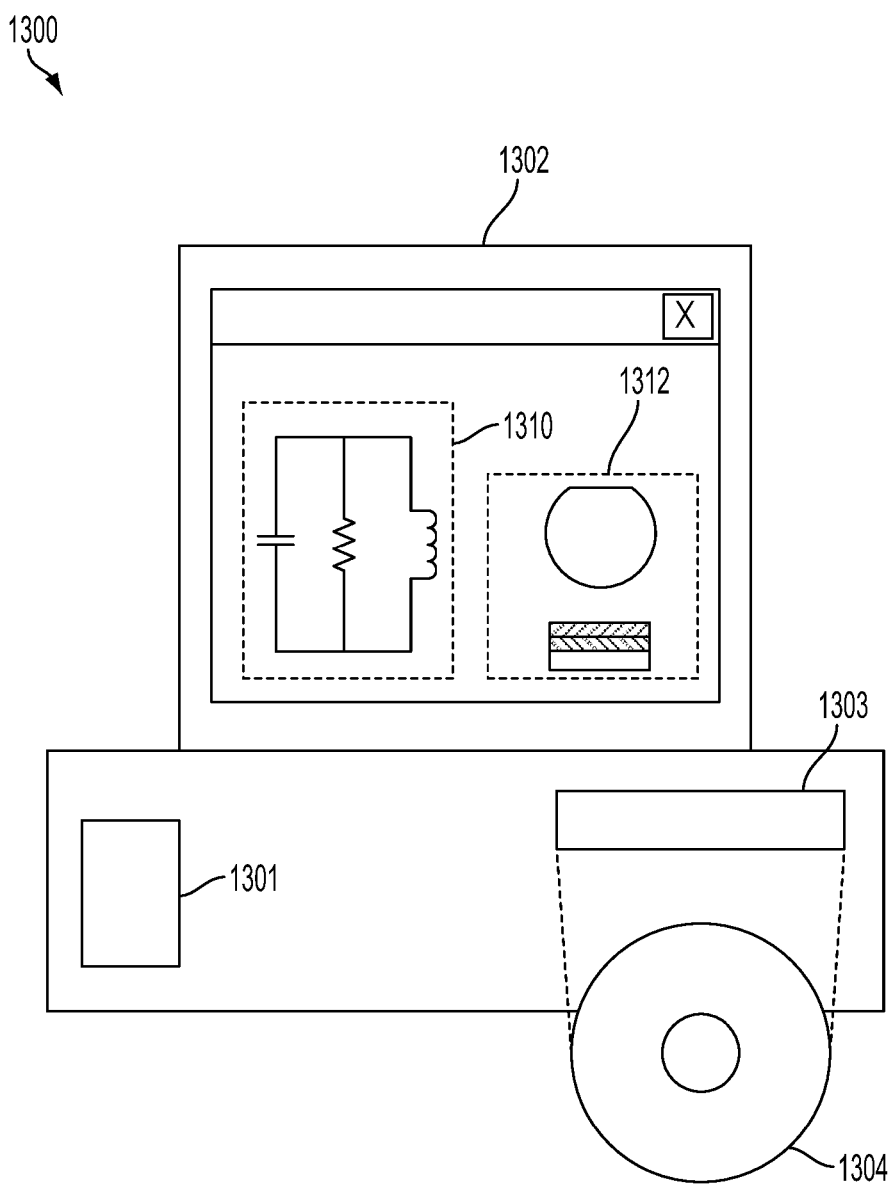
FIG. 13 is a block diagram illustrating a design workstation used for circuit, layout, and logic design of a semiconductor component according to one configuration.

FIG. 13 is a block diagram illustrating a design workstation used for circuit, layout, and logic design of a semiconductor component, such as the dual-sided active devices disclosed above. A design workstation 1300 includes a hard disk 1301 containing operating system software, support files, and design software such as Cadence or OrCAD. The design workstation 1300 also includes a display 1302 to facilitate design of a circuit 1310 or a semiconductor component 1312 such as the dual-sided active devices. A storage medium 1304 is provided for tangibly storing the circuit design 1310 or the semiconductor component 1312. The circuit design 1310 or the semiconductor component 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit design 1310 or the semiconductor component 1312 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit device, comprising:
   a front-side transistor including a source/drain region directly on a front-side surface of an isolation layer, the front-side transistor including a front-side contact directly on a portion of the source/drain region of the front-side transistor;
   a backside transistor including a source/drain region directly on a backside surface opposite the front-side surface of the isolation layer, the backside transistor including a backside contact, the backside contact having a first surface and an opposite second surface, the first surface of the backside contact directly on a portion of the source/drain region of the backside transistor; and
   a shared contact common to the front-side transistor and the backside transistor, the shared contact on the second surface of the backside contact and on at least a sidewall of the source/drain region of the backside transistor, the shared contact including a single via directly on a portion of the front-side contact on the source/drain region of the front-side transistor, a material of the shared contact being the same where it touches the second surface of the backside contact and where it touches the sidewall of the source/drain region of the backside transistor, the material of the shared contact being different from a material of the front-side contact and a material of the backside contact.

2. The integrated circuit device of claim 1, in which the front-side transistor comprises a plurality of negative metal oxide semiconductor (NMOS) transistors and the backside transistor comprises a plurality of positive metal oxide semiconductor (PMOS) transistors.

3. The integrated circuit device of claim 1, in which the single via electrically couples the source/drain region of the front-side transistor to the source/drain region of the backside transistor.

4. The integrated circuit device of claim 1, in which at least one of the front-side transistor and the backside transistor comprises a planar transistor.

5. The integrated circuit device of claim 1, in which the front-side transistor is offset from the backside transistor.

6. The integrated circuit device of claim 1, in which the isolation layer comprises a buried oxide (BOX) layer.

7. The integrated circuit device of claim 1, in which the front-side transistor and the backside transistor comprises a radio frequency (RF) switch.

8. The integrated circuit device of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

9. An integrated circuit device, comprising:
   a front-side transistor including a source/drain region directly on a front-side surface of an isolation layer, the front-side transistor including a front-side contact directly on a portion of the source/drain region of the front-side transistor;
   a backside transistor including a source/drain region directly on a backside surface of the isolation layer, the backside transistor including a backside contact, the backside contact having a first surface and an opposite second surface, the first surface of the backside contact directly on a portion of the source/drain region of the backside transistor; and
   means for electrically coupling the front-side transistor with the backside transistor, the coupling means on the second surface of the backside contact and on at least a sidewall of the source/drain region of the backside transistor, the electrically coupling means directly on a portion of the front-side contact on the source/drain region of the front-side transistor, a material of the electrically coupling means being the same where it touches the second surface of the backside contact and where it touches the sidewall of the source/drain region of the backside transistor, the material of the electrically coupling means being different from a material of the front-side contact and a material of the backside contact.

10. The integrated circuit device of claim 9, in which the front-side transistor and the backside transistor comprises planar transistors.

11. The integrated circuit device of claim 9, in which the front-side transistor is offset from the backside transistor.

12. The integrated circuit device of claim 9, in which the front-side transistor and the backside transistor comprises a radio frequency (RF) switch.

13. The integrated circuit device of claim 9, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

14. A radio frequency (RF) front end module, comprising:
an integrated RF circuit device, comprising a front-side transistor including a source/drain region directly on a front-side surface of an isolation layer, the front-side transistor including a front-side contact directly on a portion of the source/drain region of the front-side transistor, a backside transistor including a source/drain region directly on a backside surface of the isolation layer, the backside transistor including a backside contact, the backside contact having a first surface and an opposite second surface, the first surface of the backside contact directly on a portion of the source/drain region of the backside transistor, and a shared contact common to the front-side transistor and the backside transistor, the shared contact on the second surface of the backside contact and on at least a sidewall of the source/drain region of the backside transistor, the shared contact including a single via directly on a portion of the front-side contact on the source/drain region of the front-side transistor, a material of the shared contact being the same where it touches the second surface of the backside contact and where it touches the sidewall of the source/drain region of the backside transistor, the material of the shared contact being different from a material of the front-side contact and a material of the backside contact;
a switch transistor comprising the front-side transistor and the backside transistor; and
an antenna coupled to an output of the switch transistor.

15. The RF front end module of claim 14, incorporated into at least one of a music player, a video player, an entertainment unit, a navigation device, a communications device, a personal digital assistant (PDA), a fixed location data unit, a mobile phone, and a portable computer.

* * * * *